United States Patent
Takeuchi

(10) Patent No.: US 6,590,616 B1
(45) Date of Patent: Jul. 8, 2003

(54) IMAGE PROCESSOR AND INTEGRATED CIRCUIT FOR THE SAME

(75) Inventor: Kesatoshi Takeuchi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/147,575

(22) PCT Filed: May 25, 1998

(86) PCT No.: PCT/JP98/02286
§ 371 (c)(1),
(2), (4) Date: Jan. 26, 1999

(87) PCT Pub. No.: WO98/54891
PCT Pub. Date: Dec. 3, 1998

(30) Foreign Application Priority Data

May 27, 1997 (JP) ............................................. 9-154480
Jan. 9, 1998 (JP) ........................................... 10-015111

(51) Int. Cl.[7] ................................................. H04N 9/64
(52) U.S. Cl. ...................... 348/572; 348/571; 348/537; 348/715
(58) Field of Search ................................ 348/572, 573, 348/571, 714, 715, 705, 537, 536, 525; 341/126, 144, 155, 157, 159

(56) References Cited

U.S. PATENT DOCUMENTS

| | | | |
|---|---|---|---|
| 4,403,253 A | * 9/1983 | Morris et al. ................. | 348/572 |
| 4,417,233 A | 11/1983 | Inoue et al. | |
| 5,045,951 A | 9/1991 | Kimura et al. | |
| 5,192,996 A | * 3/1993 | Sakashita et al. ............. | 348/572 |
| 5,325,189 A | * 6/1994 | Mimura ..................... | 348/231.6 |
| 5,438,373 A | * 8/1995 | Cummins .................... | 345/605 |
| 5,452,022 A | * 9/1995 | Yamamoto et al. ........ | 348/14.14 |
| 5,541,665 A | 7/1996 | Urata et al. | |
| 5,982,453 A | * 11/1999 | Willis ......................... | 348/565 |
| 6,141,057 A | * 10/2000 | Cooper et al. .............. | 348/512 |
| 6,429,904 B2 | * 8/2002 | Sani et al. .................. | 341/155 |

FOREIGN PATENT DOCUMENTS

| | | |
|---|---|---|
| JP | 57-12493 | 1/1982 |
| JP | 60-29029 | 2/1985 |
| JP | 60-160222 | 8/1985 |
| JP | 63-157522 | 6/1988 |

OTHER PUBLICATIONS

A. Montijo, et al., Hewlett–Packard Journal, vol. 44, No. 5, pp. 38–46, XP–000403450, "Accuracy in Interleaved ADC Systems", Oct. 1, 1993.

F. Goodenough, Electronic Design, vol. 42, No. 2, pp. 123–124, 126 and 128, XP–000424724, "Clever Designs Spawn 40–MHz/10–Bit/0.2–W ADCs", Jan. 24, 1994.

C. S. G. Conroy, et al., IEICE Transactions on Electronics, vol. E76–C, No. 5, pp. 787–794, XP–000381120, "An 8–B85–MS/S Parallel Pipeline A/D Converter in 1–μM CMOS", May 1, 1993.

* cited by examiner

Primary Examiner—John Miller
Assistant Examiner—Jean W. Désir
(74) Attorney, Agent, or Firm—Oblon, Spivak, McClelland, Maier & Neustadt, P.C.

(57) ABSTRACT

The present invention provides a technique that facilitates A-D conversion and D-A conversion of high-frequency image signals. Three A-D converters 71 through 73 successively carry out A-D conversion of an analog image signal AV1, in response to three sampling clock signals SAD1 through SAD3, which respectively have a frequency that is ⅓ of a frequency of a dot clock signal DCLK1 and phases that are sequentially shifted by a period of the dot clock signal DCLK1, thereby generating three digital image signals D1 through D3 with respect to three consecutive pixels. The digital image signals for the three pixels are written into consecutive storage areas in a frame memory 26. Reading operation of an image signal from the frame memory 26 is also carried out at a frequency that is ⅓ of a frequency of a read dot clock signal. The working number of A-D converters and the working number of D-A converters are regulated according to the frequency of the analog image signal.

46 Claims, 20 Drawing Sheets

IMAGE PROCESSOR AND INTEGRATED CIRCUIT FOR THE SAME

BACKGROUND OF THE INVENTION

1. Field of the Invention

The present invention relates to an image processing apparatus having functions of A-D conversion and D-A conversion, and more specifically pertains to a technique of processing high-frequency image signals.

2. Discussion of the Background

With recent advance in video technology, image signals processed by an image processing apparatus tend to have higher frequency. The higher frequency of image signals requires higher operating frequencies of an analog-to-digital conversion (hereinafter referred to as 'A-D conversion') unit and a digital-to-analog conversion (hereinafter referred to as 'D-A conversion') unit.

Since there is a limit of enhancing the operating frequencies of the A-D converter and D-A converter, however, it is difficult to carry out A-D conversion and D-A conversion of high-frequency image signals.

The object of the present invention is thus to solve the above problem of the prior art and provide a technique that facilitates A-D conversion and D-A conversion of high-frequency image signals.

SUMMARY OF THE INVENTION

At least part of the above and the other related objects is attained by a first image processing apparatus of the present invention, which includes: a first sampling clock generator that generates Nw first sampling clock signals, which respectively have a first frequency that is synchronous with a first synchronizing signal of a given first analog image signal and phases that are sequentially shifted; and an A-D conversion unit that converts the first analog image signal with respect to Nw pixels into Nw digital image signals, wherein the A-D conversion unit has Nw A-D converters, which commonly receive the first analog image signal and successively carry out A-D conversion of the first analog image signal in response to the Nw first sampling clock signals having the sequentially shifted phases, thereby generating the Nw digital image signals with respect to the Nw pixels, the Nw digital image signals having phases sequentially shifted.

In the above image processing apparatus, since each of the Nw A-D converters carries out A-D conversion at the relatively low first frequency, the input analog image signal having the high frequency can be readily converted to digital image signals.

In accordance with one preferable application of the first image processing apparatus, the first sampling clock generator includes: a first original sampling clock generation circuit that generates a first original sampling clock signal having the first frequency, in response to the first synchronizing signal; and a first sampling clock generation circuit that generates the Nw first sampling clock signals having the sequentially shifted phases, in response to the first original sampling clock signal.

This structure generates the original sampling clock signal, which is synchronous with the synchronizing signal of the analog image signal, in order to facilitate generation of the Nw first sampling clock signals that are synchronous with the synchronizing signal and have the sequentially shifted phases.

In the first image processing apparatus of this structure, it is preferable that the first sampling clock generation circuit initializes the Nw first sampling clock signals having the sequentially shifted phases, in response to a pulse of the first synchronizing signal, so that a fixed phase relationship is attained between the first synchronizing signal and each of the Nw first sampling clock signals having the sequentially shifted phases.

This arrangement enables the Nw first sampling clock signals to respectively hold the fixed phase relations to the synchronizing signal of the analog image signal. Accordingly each of the pixels arranged in time series and included between the pulses of the synchronizing signal of the analog image signal undergoes A-D conversion at a fixed phase.

In the first image processing apparatus discussed above, it is preferable that the first sampling clock generation circuit includes: a first PLL circuit that generates a first dot clock signal having a second frequency suitable for sampling the first analog image signal, in response to the first original sampling clock signal, the second frequency being Nw times the first frequency; and a first sampling clock extraction circuit that extracts the Nw first sampling clock signals, which have the first frequency and the phases sequentially shifted by a period of the first dot clock signal, in response to the first dot clock signal.

The generation of the dot clock signal having the second frequency, which is Nw times the first frequency, facilitates generation of the Nw first sampling clock signals that are suitable for A-D conversion in the Nw A-D converters.

In the first image processing apparatus discussed above, it is also preferable that the first sampling clock generation circuit includes: a first delay clock generation circuit that sequentially delays the first original sampling clock signal to generate the Nw first sampling clock signals having the sequentially shifted phases.

This structure generates the Nw first sampling clock signals without generating the dot clock signal having the relatively high second frequency. The advantage of this structure is that transfer of high-frequency signals is not required through wiring between the respective circuits when the circuits are mounted on a printed board.

In accordance with one preferable application, the first image processing apparatus having any one of the above structures further includes: an image memory that stores digital image signals; and a write control unit that writes the Nw digital image signals output from the A-D conversion unit into continuous storage areas in the image memory.

The write control unit writes the Nw digital image signals with respect to the Nw pixels into the consecutive storage areas of the image memory, so that the digital image signals are stored in the sequence of the original pixel array.

In accordance with another preferable application of the first image processing apparatus having any one of the above structures, the first sampling clock generator includes: a second sampling clock generation circuit that generates Nw second sampling clock signals, which have sequentially shifted phases and maintain fixed phase relations respectively to the Nw first sampling clock signals having the sequentially shifted phases, wherein the A-D conversion unit further includes Nw latch circuits that latch and output the Nw digital image signals, which are output from the Nw A-D converters and have the sequentially shifted phases, in response to the Nw second sampling clock signals having the sequentially shifted phases.

In this structure, the A-D conversion unit outputs the Nw digital image signals, which are output from the Nw A-D converters and have the sequentially shifted phases, in response to the second sampling clock signals that hold the fixed phase relations to the first sampling clock signals.

In the first image processing apparatus of this structure, the write control unit receives the Nw digital image signals supplied from the A-D conversion unit and at least one of the Nw second sampling clock signals, which are supplied from the first sampling clock generator and have the sequentially shifted phases.

This structure enables the write control unit to utilize the signal that is synchronous with the digital image signals output from the A-D converters. This effectively prevents the write control unit from sampling the digital image signals at transitional periods of the data, thereby ensuring sampling of the digital image signals.

In accordance with one preferable application of the first image processing apparatus discussed above, the write control unit includes plural stages of digital image signal phase regulation circuits that cause the Nw digital image signals, which have the sequentially shifted phases and are supplied from the A-D conversion unit, to be output in an identical phase. The plural stages of digital image signal phase regulation circuits have a hierarchical structure, in which a number of circuits included in each stage gradually decreases towards a last stage. A plurality of digital image signal phase regulation circuits included in each stage, except the last stage, latch a plurality of input digital image signals in fixed phases, which are different from one another, and supply the latched digital image signals to digital image signal phase regulation circuits included in a next stage. A digital image signal phase regulation circuit included in the last stage latches the Nw digital image signals supplied from a previous stage in an identical phase.

This arrangement enables the digital image signal phase regulation circuits included in each stage to carry out sampling at relatively marginal timings, so that the Nw digital image signals having the sequentially shifted phases can be changed readily to the digital image signals of an identical phase.

The first image processing apparatus discussed above may further include: a first switching circuit that supplies at least part of the Nw first sampling clock signals having the sequentially shifted phases to arbitrary A-D converters selected among the Nw A-D converters; and a second switching circuit that supplies at least part of the Nw second sampling clock signals having the sequentially shifted phases to selected latch circuits among the Nw latch circuits, the selected latch circuits corresponding to the arbitrary A-D converters to which the first sampling clock signals are supplied by the first switching circuit.

This structure supplies the first and the second sampling clock signals to the arbitrary A-D converters and the latch circuits, and thereby enables the Nw A-D converters and Nw latch circuits to be activated in an arbitrary sequence.

In accordance with one preferable application of the first image processing apparatus having any one of the above structures, the first sampling clock generator and the A-D conversion unit are integrated into one chip.

Such integration reduces the possibility of incorrect operation in the case of processing the signals of relatively high frequency.

The present invention is also directed to a second image processing apparatus, which includes: a second sampling clock generator that generates Nr third sampling clock signals, which respectively have a third frequency that is synchronous with a second synchronizing signal of a second analog image signal to be output and phases that are sequentially shifted; Nr D-A converters that receive digital image signals with respect to Nr pixels in parallel, carry out D-A conversion of the digital image signals with respect to the Nr pixels, in response to the Nr third sampling clock signals having the sequentially shifted phases, thereby generating Nr partial analog image signals having sequentially shifted phases; and a video switch that successively selects the Nr partial analog image signals output from the Nr D-A converters, so as to generate the second analog image signal.

In the second image processing apparatus, since each of the Nr D-A converters carries out D-A conversion at the relatively low third frequency, the digital images signals can be readily converted to the output analog image signal having the high frequency.

The present invention is further directed to a third image processing apparatus, which includes: an A-D conversion unit having Mw A-D converters (where Mw is an integer of not less than 2), into which a given first analog image signal is commonly input; a first sampling clock generator that generates Nw first sampling clock signals (where Nr is an integer of not less than 1 and not greater than Mw and denotes a working number of A-D converters actually used), which respectively have a first frequency that is synchronous with a first synchronizing signal of the first analog image signal and phases that are sequentially shifted; and a write control signal regulation unit that halts operation of unused (Mw−Nw) A-D converters according to the working number Nw of the A-D converters, controls operation of the first sampling clock generator according to the working number Nw, and causes the Nw A-D converters to successively carry out A-D conversion of the first analog image signal in response to the Nw first sampling clock signals having the sequentially shifted phases, thereby generating digital image signals with respect to Nw pixels.

The third image processing apparatus has the same functions and effects as those of the first image processing apparatus. Additional advantage of the third image processing apparatus is to reduce the power consumption by regulating the working number Nw of the A-D converters according to the frequency of the first analog image signal.

The present invention is also directed to a fourth image processing apparatus, which includes: Mr D-A converters (where Mr is an integer of not less than 2); a second sampling clock generator that generates Nr third sampling clock signals (where Nr is an integer of not less than 1 and not greater than Mr and denotes a working number of D-A converters actually used), which respectively have a third frequency that is synchronous with a second synchronizing signal of a second analog image signal to be output and phases that are sequentially shifted; a read control signal regulation unit that halts operation of unused (Mr−Nr) D-A converters according to the working number Nr of the D-A converters, controls operation of the second sampling clock generator according to the working number Nr, and causes the Nr D-A converters to successively carry out D-A conversion of digital image signals with respect to Nr pixels, in response to the Nr third sampling clock signals having the sequentially shifted phases, thereby generating Nr partial analog image signals that have phases sequentially shifted; and a video switch that successively selects the Nr partial analog image signals output from the Nr D-A converters, so as to generate the second analog image signal.

The fourth image processing apparatus has the same functions and effects as those of the second image processing apparatus. Additional advantage of the fourth image processing apparatus is to reduce the power consumption by regulating the working number Nr of the D-A converters according to the frequency of the second analog image signal.

Each of the first and the third image processing apparatuses may further include a phase regulation circuit that generates an external sampling clock signal from the first original sampling clock signal, the external sampling clock signal having an identical period to that of the first original sampling clock signal and a phase suitable for processing the Nw digital image signals.

In the image processing apparatus of this structure, the phase regulation circuit generates the external sampling clock signal, which has the phase suitable for processing the Nw digital image signals. Accordingly the suitable sampling clock signal can be supplied to a subsequent circuit, when the delay of data after the A-D conversion gives a significant influence on the subsequent circuit.

In accordance with one preferable application of the first image processing apparatus, the Nw A-D converters are provided for each of plural color signals representing a color image, and the Nw A-D converters for each color signal are integrated into a separate integrated circuit.

In this image processing apparatus, since the Nw A-D converters are integrated for each color signal, the reference voltage for regulating a variation intrinsic to the A-D converters can be set common to the A-D converters of one-chip configuration, thereby effectively reducing a variation in luminance among the pixels with respect to each color.

In accordance with one preferable application of the second image processing apparatus, the Nr D-A converters are provided for each of plural color signals representing a color image, and the Nr D-A converters for each color signal are integrated into a separate integrated circuit.

In this image processing apparatus, since the Nr D-A converters are integrated for each color signal, the reference voltage for regulating a variation intrinsic to the D-A converters can be set common to the D-A converters of one-chip configuration, thereby effectively reducing a variation in luminance among the pixels with respect to each color.

In accordance with one preferable application of the third image processing apparatus, the Mw A-D converters are provided for each of plural color signals representing a color image, and the Mw A-D converters for each color signal are integrated into a separate integrated circuit.

In this image processing apparatus, since the Mw A-D converters are integrated for each color signal, the reference voltage for regulating a variation intrinsic to the A-D converters can be set common to the A-D converters of one-chip configuration, thereby effectively reducing a variation in luminance among the pixels with respect to each color.

In accordance with one preferable application of the fourth image processing apparatus, the Mr D-A converters are provided for each of plural color signals representing a color image, and the Mr D-A converters for each color signal are integrated into a separate integrated circuit.

In this image processing apparatus, since the Mr D-A converters are integrated for each color signal, the reference voltage for regulating a variation intrinsic to the D-A converters can be set common to the D-A converters of one-chip configuration, thereby effectively reducing a variation in luminance among the pixels with respect to each color.

The present invention is also directed to an image display apparatus, which includes any one of the first through the fourth image processing apparatuses; and a display unit that displays an image processed by the image processing apparatus.

This arrangement enables the image processed by one of the first through the fourth image processing apparatuses to be displayed on the display unit, such as a liquid-crystal panel.

There are a variety of other aspects of the present invention as discussed below.

A first aspect is a recording medium, on which a computer program for causing a computer to carry out at least part of the respective steps or the respective units of the present invention is recorded. Available examples of the recording media include flexible disks, CD-ROMs, magneto-optic discs, punched cards, prints with barcodes or other codes printed thereon, internal storage devices (memories like RAM and ROM) and external storage devices of the computer, and a variety of other computer readable media.

A second aspect is a program supply apparatus that supplies a computer program for causing the computer to carry out at least part of the respective steps or the respective units of the present invention, via a communication path.

DETAILED DESCRIPTION OF THE PREFERRED EMBODIMENTS

A. First Embodiment

Figure 1:
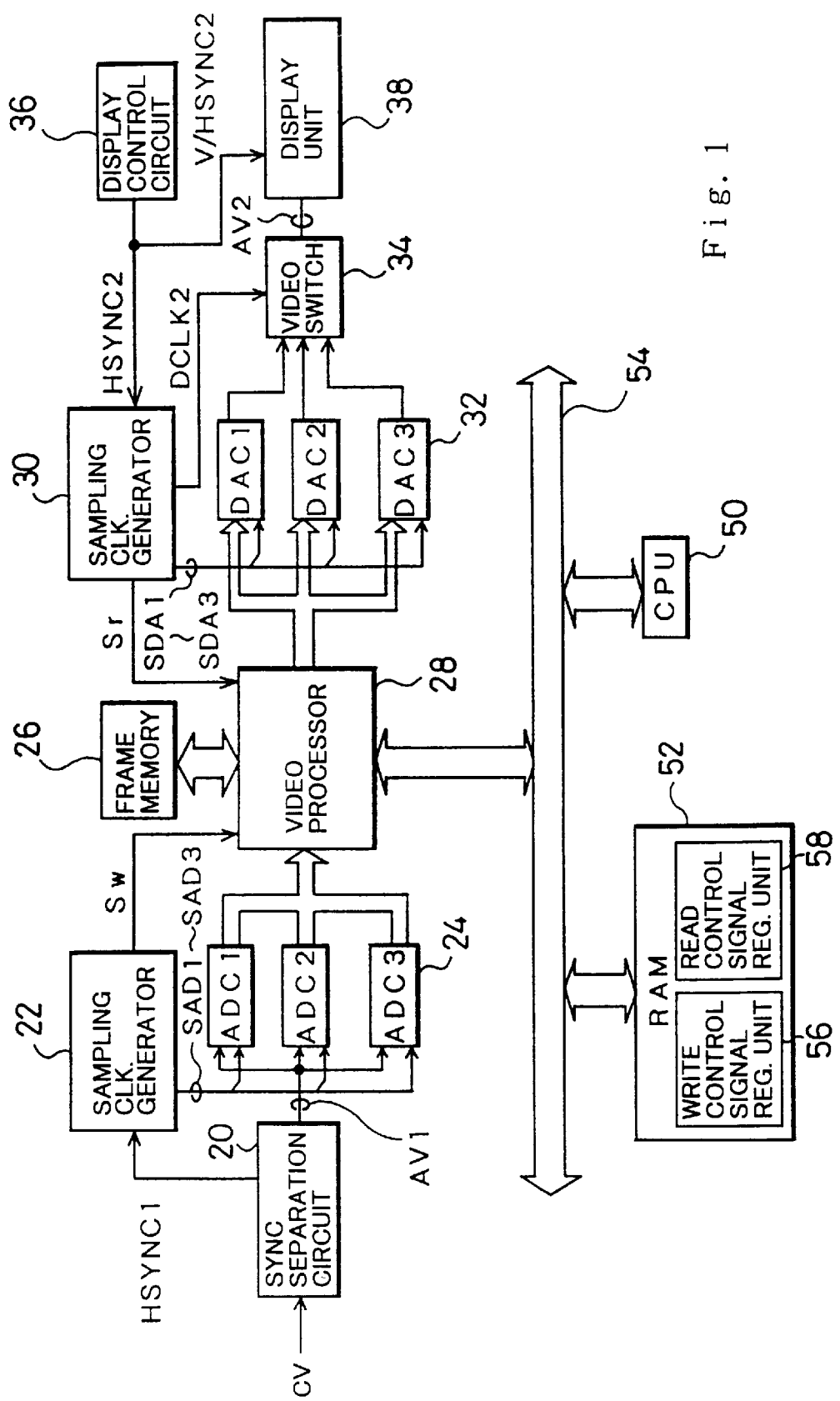
FIG. 1 is a block diagram illustrating the general structure of an image processing apparatus in one embodiment according to the present invention.

Some modes for carrying out the present invention are described below as preferred embodiments. FIG. 1 is a block diagram illustrating the general structure of an image processing apparatus in a first embodiment according to the present invention. The image processing apparatus is constructed as a computer including a synchronizing signal separation circuit 20, a write sampling clock generator 22, an A-D conversion unit 24 including three A-D converters, a frame memory 26, a video processor 28, a read sampling clock generator 30, a D-C conversion unit 32 including three D-A converters, a video switch 34, a display control circuit 36, a display unit 38, a CPU 50, and a RAM 52. The video processor 28, the CPU 50, and the RAM 52 are mutually connected via a bus 54. The two sampling clock generators 22 and 30 and the display control circuit 36 are also connected to the bus 54, although the connection is omitted from the illustration of FIG. 1.

The synchronizing signal separation circuit 20 separates synchronizing signals from a given composite image signal CV and outputs the synchronizing signals and component image signals (that is, an analog image signal without the synchronizing signals). The component image signals consist of three color signals representing images of three colors, R, G, and B. The horizontal synchronizing signal HSYNC1 separated by the synchronizing signal separation circuit 20 is supplied to the write sampling clock generator 22.

The component image signals output from the synchronizing signal separation circuit 20 are converted into digital image signals by the three A-D converters included in the A-D conversion unit 24. As discussed later, the three A-D converters are successively switched to carry out A-D conversion at the frequency that is ⅓ of the frequency of the analog image signal AV1. Its detailed operations will be discussed later.

The video processor 28 is a microprocessor that carries out control operations for writing and reading images into and from the frame memory 26. The digital image signals output from the A-D conversion unit 24 are once written into the frame memory 26 and read from the frame memory 26 when required. The digital image signals read from the frame memory 26 are converted into three partial analog image signals by the D-A conversion unit 32. The details of this conversion will be described later. The three partial analog image signals are successively switched by the video switch 34 to compose one analog image signal AV2. The display unit 38 displays a resulting image, in response to the analog image signal AV2 and synchronizing signals (a vertical synchronizing signal VSYNC2 and a horizontal synchronizing signal HSYNC2) output from the display control circuit 36. A variety of display devices using a liquid-crystal panel, a CRT, or a plasma display panel may be applied for the display unit 38.

The A-D conversion and the writing operation of image signals into the frame memory 26 are carried out synchronously with the synchronizing signal output from the synchronizing signal separation circuit 20. The write sampling clock generator 22 generates sampling clock signals SAD1 through SAD3, which will be utilized for the A-D conversion, based on the horizontal synchronizing signal HSYNC1 and supplies the sampling clock signals SAD1 through SAD3 to the A-D conversion unit 24. The write sampling clock generator 22 also generates a write sampling clock signal Sw, which will be utilized for the writing operation, and supplies the write sampling clock signal Sw to the video processor 28.

The reading operation of the image signals from the frame memory 26 and the D-A conversion of the read-out image signals are carried out synchronously with the synchronizing signal output from the display control circuit 36. The read sampling clock generator 30 generates sampling clock signals SDA1 through SDA3, which will be utilized for the D-A conversion, based on the horizontal synchronizing signal HSYNC2 and supplies the sampling clock signals SDA1 through SDA3 to the D-A conversion unit 32. The read sampling clock generator 30 also generates a read sampling clock signal Sr, which will be utilized for the reading operation, and supplies the read sampling clock signal Sr to the video processor 28.

Computer programs functioning as a write control signal regulation unit 56 and computer programs functioning as a read control signal regulation unit 58 are stored in the RAM 52. The write control signal regulation unit 56 sets parameters (discussed later) for regulating the frequencies of the various sampling clock signals Sw and SAD1 through SAD3 used in the writing process, into the write sampling clock generator 22. The read control signal regulation unit 58, on the other hand, sets parameters (discussed later) for regulating the frequencies of the various sampling clock signals Sr and SDA1 through SDA3 used in the reading process, into the read sampling clock generator 30. The detailed functions of the respective units will be described later.

The computer programs for implementing the functions of these units are recorded on a computer readable recording medium, such as a floppy disk and a CD-ROM. The computer (image processing apparatus) reads the computer programs from the recording medium and transfers the computer programs into an internal storage device or an external storage device. Alternatively the computer programs may be supplied from a program supply apparatus to the computer via a communication path. The CPU 50 (microprocessor) of the computer executes the computer programs stored in the internal storage device, in order to implement the functions of the computer. The computer may otherwise directly execute the computer programs recorded on the recording medium.

In this specification, the computer is a concept including both a hardware apparatus and an operating system, and represents the hardware apparatus working under the control of the operating system. When an operating system is not required and an application program alone can operate the hardware apparatus, the hardware apparatus itself corresponds to the computer. The hardware apparatus at least has a microprocessor, such as a CPU, and a unit for reading the computer programs recorded on a recording medium. The computer programs include program codes that cause the computer to carry out the functions of the respective units discussed above. Part of the above functions may be executed by the operating system, instead of the applications program.

Available examples of the 'recording media' in the present invention include flexible disks, CD-ROMs, magneto-optic discs, IC cards, ROM cartridges, punched cards, prints with barcodes or other codes printed thereon, internal storage devices (memories like RAM and ROM) and external storage devices of the computer, and a variety of other computer readable media.

Figure 2:
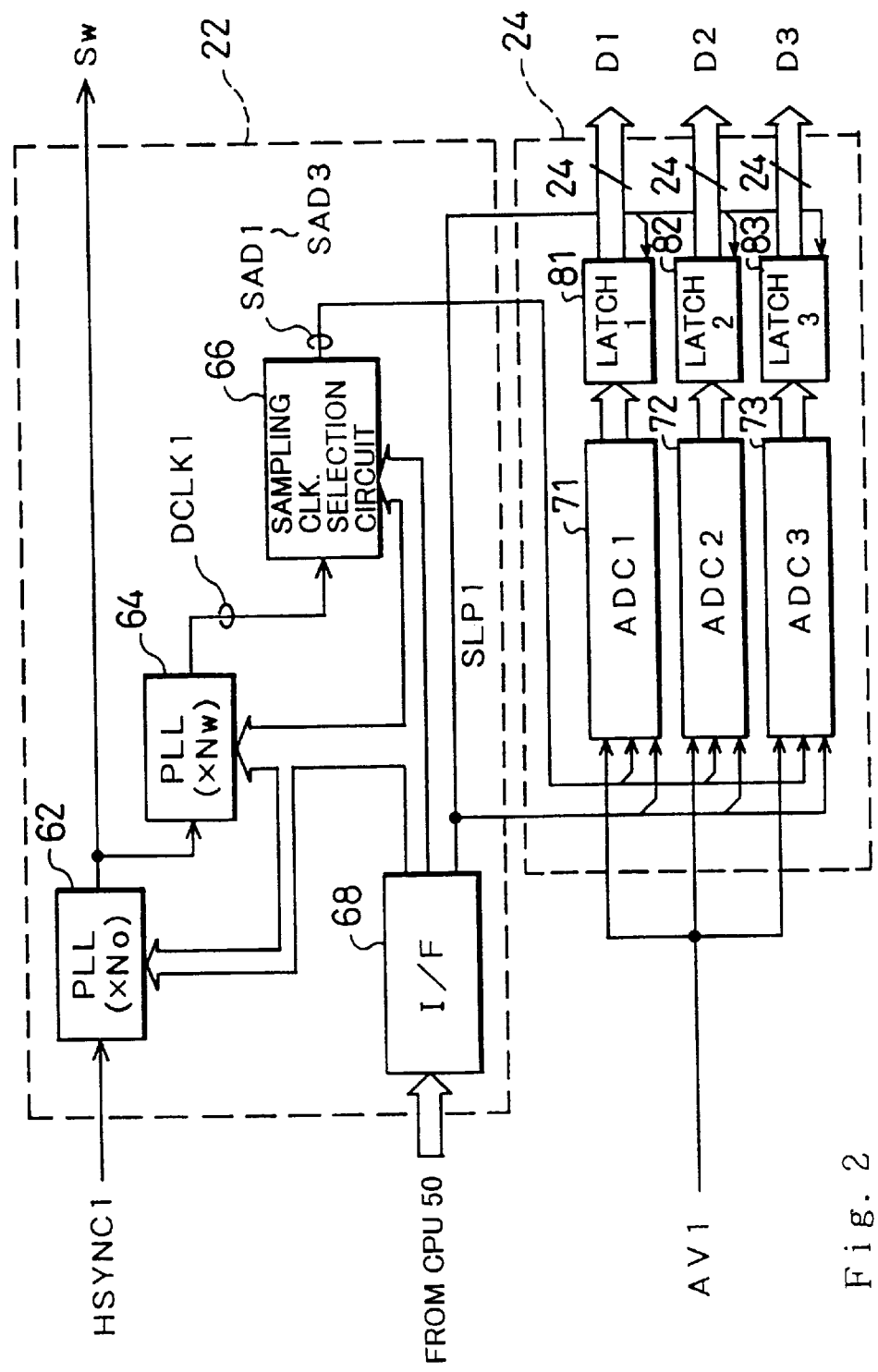
FIG. 2 is a block diagram illustrating the internal structure of the write sampling clock generator 22 and the A-D conversion unit 24.

FIG. 2 is a block diagram illustrating the internal structure of the write sampling clock generator 22 and the A-D conversion unit 24. The write sampling clock generator 22 includes two PLL circuits 62 and 64, a sampling clock selection circuit 66, and a CPU interface circuit 68. The A-D conversion unit 24 includes three A-D converters 71 through 73 and three latches 81 through 83. The three A-D converters 71 through 73 are separately integrated into one-chip configurations.

FIGS. 3(a)–3(j) are timing charts showing primary signals relating to the writing operations of image signals. The following describes the operations in the circuit of FIG. 2 with the timing chart of FIGS. 3(a)–3(j).

Figure 3:
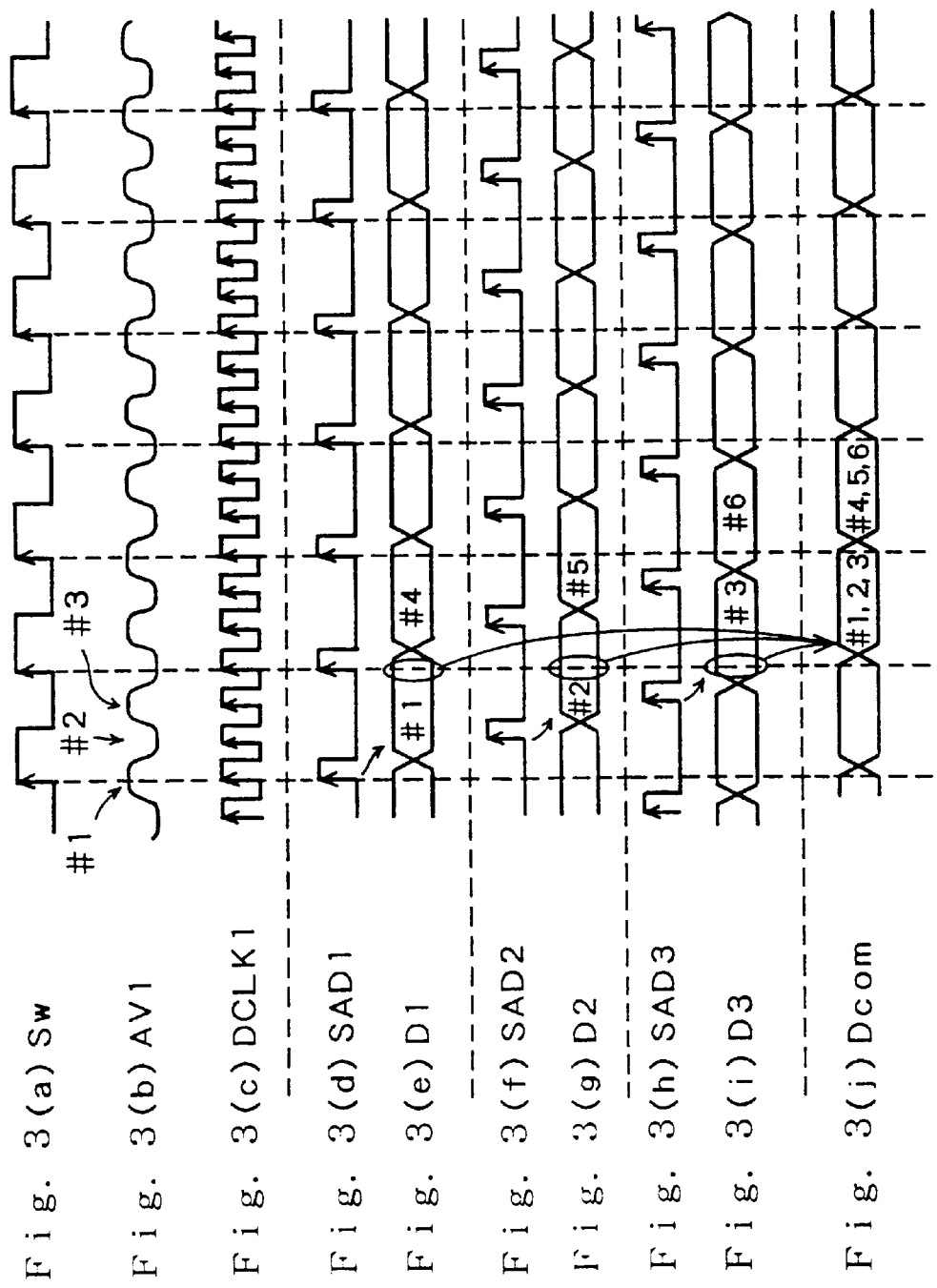
FIGS. 3(a)–3(j) are timing charts showing primary signals relating to the writing operations of image signals.

The first PLL circuit 62 in the write sampling clock generator 22 multiplies the horizontal synchronizing signal HSYNC1 output from the synchronizing signal separation circuit 20 (FIG. 1) by N0, so as to generate the write sampling clock signal Sw. The second PLL circuit 64 further multiplies this write sampling clock signal Sw by Nw, so as to generate a dot clock signal DCLK1. FIGS. 3(a) through 3(c) show the waveforms of the write sampling clock signal Sw, the analog image signal AV1 input into the A-D conversion unit 24, and the dot clock signal DCLK1. The signal level of the analog image signal AV1 shown in FIG. 3(b) has one peak at every pixel. Symbols #1 through #3 denote three pixels that are present on one horizontal line. The dot clock signal DCLK1 has the frequency and the phase suitable for sampling all the pixels of the analog image signal AV1. The A-D conversion of the analog image signal AV1 at rising edges of the dot clock signal DCLK1 enables conversion of all the pixels #1, #2, #3, ... into digital image signals. In the case where the dot clock signal DCLK1 has a high frequency, extremely high-speed A-D converters are required for the A-D conversion in response to the dot clock signal DCLK1. The arrangement of this embodiment, on the other hand, ensures the A-D conversion of the analog image signal AV1 with respect to all the pixels by simply carrying out the A-D conversion at the frequency that is a fraction of the frequency of the dot clock signal DCLK1.

The write sampling clock signal Sw shown in FIG. 3(a) is synchronous with the horizontal synchronizing signal HSYNC1 of the input analog image signal AV1 and has the frequency that is 1/Nw of the frequency of the dot clock signal DCLK1 (where Nw denotes the multiplier in the second PLL circuit 64). The multiplier Nw in the second PLL circuit 64 is generally set equal to the total number of the A-D converters 71 through 73. In the example of FIG. 2, the multiplier Nw is set equal to 3. The A-D conversion in the A-D conversion unit 24 and the writing operation of the digital image signals into the frame memory 26 are carried out at the same frequency as that of the write sampling clock signal Sw.

The sampling clock selection circuit 66 generates the three sampling clock signals SAD1 through SAD3, which will be supplied to the three A-D converters 71 through 73, from the dot clock signal DCLK1. FIGS. 3(d), 3(f), and 3(h) show the waveforms of these three sampling clock signals SAD1 through SAD3. The three sampling clock signals SAD1 through SAD3 have the same frequency as that of the write sampling clock signal Sw and the phases that are sequentially shifted by the period of the dot clock signal DCLK1. The sampling clock selection circuit 66 successively selects the pulses out of the dot clock signal DCLK1 at the ratio of one pulse to three pulses and outputs the selected pulses, so as to generate the three sampling clock signals SAD1 through SAD3.

As shown in FIG. 2, the analog image signal AV1 is commonly input into the three A-D converters 71 through 73, whereas the three sampling clock signals SAD1 through SAD3 are respectively supplied to the three A-D converters 71 through 73. The first A-D converter 71 carries out A-D conversion of the analog image signal AV1 at a rising edge of the first sampling clock signal SAD1. A resulting digital image signal D1 is latched by the first latch 81. FIG. 3(e) shows the state in which the digital image signal of the first pixel #1 sampled at a rising edge of the first sampling clock signal SAD1 is latched by and output from the first latch 81. Similarly FIG. 3(g) shows the state in which the digital image signal of the second pixel #2 sampled at a rising edge of the second sampling clock signal SAD2 is latched by and output from the second latch 82. FIG. 3(i) shows the state in which the digital image signal of the third pixel #3 sampled at a rising edge of the third sampling clock signal SAD3 is latched by and output from the third latch 83.

The digital image signal of each pixel has three color signals representing three colors, for example, R, G, and B. When the respective color signals of R, G, and B are 8-bit data, each of digital image signals D1 through D3 is 24-bit data. Each of the three A-D converters 71 through 73 has separate converters of the three colors for conversion of the three color signals.

The digital image signals D1 through D3 with respect to the three pixels thus obtained are written as one set of 72-bit digital image signals Dcom (FIG. 3(j)) into consecutive storage areas in the frame memory 26. This writing operation is carried out synchronously with the write sampling clock signal Sw (FIG. 3(a)). The set of digital image signals Dcom with respect to the three pixels have the 72-bit capacity, which corresponds to the 9-byte capacity. The video processor 28 accordingly increments the write address (pixel address) given to the frame memory 26 by nine on every writing operation. When the writing operation of the digital image signals corresponding to one line is concluded, the line address is incremented by one and the pixel address is initialized. This causes the digital image signals with respect to all the pixels on each line to be written into consecutive storage areas in the frame memory 26. In other words, 24-bit image signals for the respective pixels, which consist of the three color components R, G, and B, are arranged in the sequence of the original pixel array of the original image and stored in the frame memory 26. The digital image signals with respect to all the pixels on an identical line are stored at the consecutive addresses in the frame memory 26. This arrangement facilitates reading the digital image signals from arbitrary positions in the frame memory 26.

In the write sampling clock generator 22 shown in FIG. 2, one PLL circuit 64 generates the dot clock signal DCLK1 suitable for sampling all the pixels in the analog image signal AV1, whereas the other PLL circuit 62 generates the write sampling clock signal Sw having the frequency that is ⅓ of the frequency of the dot clock signal DCLK1. The sampling clock selection circuit 66 generates the three sampling clock signals SAD1 through SAD3 having the frequency that is ⅓ of the frequency of the dot clock signal DCLK1 and the phases that are sequentially shifted by of the period of the dot clock signal DCLK1. As clearly understood from this explanation, the PLL circuit 62 shown in FIG. 2 corresponds to the first original sampling clock generation circuit of the present invention. The PLL circuit 64 and the sampling clock selection circuit 66 correspond to the first sampling clock generation circuit. The PLL circuit 64 and the sampling clock selection circuit 66 also correspond to the first PLL circuit and the first sampling clock extraction circuit of the present invention, respectively.

The respective A-D converters 71 through 73 shown in FIG. 2 carry out the A-D conversion at the frequency of the sampling clock signals SAD1 through SAD3. This arrangement ensures the A-D conversion at the relatively low speed as ⅓ of the speed of the A-D conversion carried out synchronously with the dot clock signal DCLK1. The digital image signals D1 through D3 with respect to the three pixels obtained as the result of the A-D conversion are written as one set of digital image signals Dcom into the consecutive storage areas in the frame memory 26. This writing operation is accordingly carried out at the frequency that is ⅓ of the frequency of the dot clock signal DCLK1. Namely in this embodiment, the A-D conversion and the writing operation into the frame memory 26 are carried out at the frequency that is ⅓ of the frequency of the dot clock signal DCLK1. The arrangement of this embodiment thus advantageously utilizes relatively low-speed hardware circuits to process the high-frequency analog image signals.

In the circuit of FIG. 2, only the sampling clock selection circuit 66 is activated in response to the high-frequency dot clock signal DCLK1. In the circuit structure of this embodiment, the required number of circuit elements activated at the high frequency is accordingly minimized. This arrangement allows the relatively simple circuit structure and saves the power consumption.

The write control signal regulation unit 56 sets the parameters, such as the multipliers N0 and Nw of the PLL circuits 62 and 64, in a non-illustrated register in the CPU interface circuit 68. The multiplier Nw in the second PLL circuit 64 is generally set equal to the total number of the installed A-D converters 71 through 73. When the dot clock signal DCLK1 has a sufficiently low frequency, one or two A-D converters may be sufficient for the A-D conversion. In such a case, activation of all the three A-D converters 71 through 73 results in undesirably large power consumption in the A-D conversion unit 24. For example, when the working clock frequency of the A-D converters 71 through 73 exceeds about 100 MHz, the power consumption of the A-D converters abruptly increases with an increase in frequency. When the A-D converters 71 through 73 have the working clock frequency of not exceeding about 100 MHz, on the other hand, the power consumption of the A-D converters is not significantly varied with an increase in frequency. In the case where the working clock frequency of the A-D converters is not greater than about 100 MHz, it is thus desirable to use only one or two A-D converters for the A-D conversion.

In this embodiment, when the frequency of the sampling clock signals SAD1 through SAD3 for the three A-D converters 71 through 73 is not greater than a predetermined value (for example, 60 MHz), the CPU interface circuit 68 outputs a sleep signal SLP1 to halt the operation of some of the three A-D converters 71 through 73. By way of example, when only the two A-D converters 71 and 72 are used, the sleep signal SLP1 is supplied to the third A-D converter 73 to halt its operation. In this case, the multiplier Nw in the second PLL circuit 64 is set equal to the working number (=2) of the A-D converters, whereas the multiplier N0 in the first PLL circuit 62 is set equal to Nw0/Nw (=3/2) times the original multiplier (where Nw0 denotes the total number of A-D converters). The first PLL circuit 62 accordingly generates the write sampling clock signal Sw having the frequency that is Nw0/Nw (=3/2) times the original frequency, whereas the second PLL circuit 64 generates the dot clock signal DCLK1 having the frequency identical with the original frequency.

In this manner, the write control signal regulation unit 56 regulates the working number Nw (where Nw ranges from 1 to 3) of the A-D converters 71 through 73 via the CPU interface circuit 68, in order to make the frequency of the sampling clock signals SAD1 through SAD3 supplied to the A-D converters 71 through 73 within a predetermined range (for example, a range from about 50 MHz to about 100 MHz). This arrangement advantageously enables the operation mode for reducing the power consumption of the image processing apparatus to be selected according to the frequency of the analog image signal AV1 to be processed. A variety of methods may be adopted to halt the operation of the A-D converter; for example, the supply of electric power to the A-D converter may be suspended, or the supply of the sampling clock signal to the A-D converter may be suspended.

The horizontal synchronizing signal HSYNC1 and the vertical synchronizing signal VSYNC1 of the input analog image signal AV1 have intrinsic properties (for example, the frequency, the phase, and the polarity of the signal) according to the resolution of the image. One typical procedure stores in advance the relationship between some resolutions of the image and the properties of the synchronizing signals in the form of a table into the memory, and analyzes the properties of the synchronizing signals separated by the synchronizing signal separation circuit 20 (FIG. 1) with a non-illustrated synchronizing signal analyzing circuit or according to a synchronizing signal analyzing program. The procedure then specifies the frequency of the dot clock signal DCLK1 corresponding to the properties of the synchronizing signals (that is, the frequency for sampling all the pixels of the analog image signal AV1), based on the table stored in the memory. The procedure determines the appropriate working number Nw of the A-D converters, based on the relationship between the frequency for sampling the analog image signal and the frequency of the sampling clock signals in the predetermined range supplied to the A-D converters. This arrangement ensures processing of the first analog image signals from a relatively low frequency to an extremely high frequency.

Figure 4:
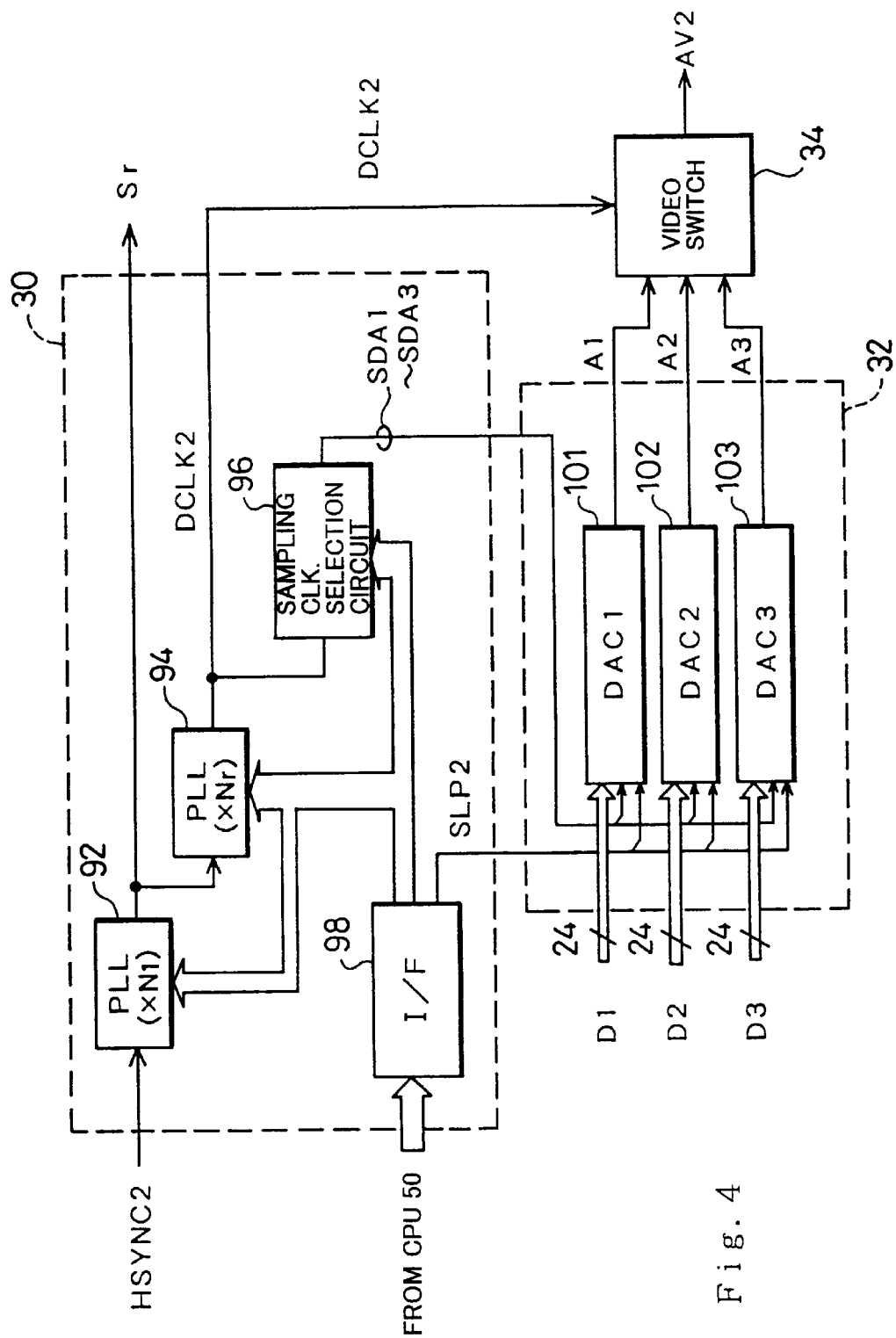
FIG. 4 is a block diagram illustrating the internal structure of the read sampling clock generator 30 and the D-A conversion unit 32 with the video switch 34.

The digital image signals stored in the frame memory 26 are read by the video processor 28 and converted into analog image signals by the D-A conversion unit 32. FIG. 4 is a block diagram illustrating the internal structure of the read sampling clock generator 30 and the D-A conversion unit 32 with the video switch 34. The read sampling clock generator 30 includes two PLL circuits 92 and 94, a sampling clock selection circuit 96, and a CPU interface circuit 98. The read sampling clock generator 30 has a similar structure to that of the write sampling clock generator 22 shown in FIG. 2. The D-A conversion unit 32 includes three D-A converters 101 through 103.

The first PLL circuit 92 in the read sampling clock generator 30 multiplies the horizontal synchronizing signal HSYNC2 output from the display control circuit 36 (see FIG. 1) by N1, so as to generate a read sampling clock signal Sr. The second PLL circuit 94 multiplies the read sampling clock signal Sr by Nr, so as to generate a dot clock signal DCLK2. The sampling clock selection circuit 96 generates the three sampling clock signals SDA1 through SDA3, which will be supplied to the three D-A converters 101 through 103, from this dot clock signal DCLK2.

The relations of the frequencies and phases between the signals Sr, DCLK2, and SDA1 through SDA3 generated in the read sampling clock generator 30 are similar to those of the frequencies and phases between the signals Sw, DCLK1, and SAD1 through SAD3 generated in the write sampling clock generator 22 (see FIG. 2). Namely the dot clock signal DCLK2 has the frequency and the phase suitable for sampling all the pixels of the analog image signal AV2 given to the display unit 38. The frequency of the dot clock signal DCLK2 depends upon the type of the display unit 38. The frequency of the read sampling clock signal Sr is 1/Nr of the frequency of the dot clock signal DCLK2. This value Nr (that is, the multiplier in the PLL circuit 94) is generally set equal to the total number of the installed D-A converters 101 through 103. The three sampling clock signals SDA1 through SDA3 have the frequency that is 1/Nr of the frequency of the dot clock signal DCLK2 and the phases that are sequentially shifted by the period of the dot clock signal DCLK2.

The three D-A converters 101 through 103 carry out D-A conversion of the digital image signals D1 through D3 respectively at rising edges of the three sampling clock signals SDA1 through SDA3. The detailed operation of the D-A conversion is just reverse to the operation of the A-D conversion shown in FIGS. 3(a)–3(j) and is not specifically described here. In the D-A conversion, for example, the digital image signals D1 through D3 with respect to the three consecutive pixels are converted into three analog image signals A1 through A3 having different phases. The three analog image signals A1 through A3 are input into the video switch 34. The video switch 34 successively selects and outputs the three analog image signals A1 through A3 synchronously with the dot clock signal DCLK2. This causes the analog image signal AV2 representing an image having the original pixel array to be output from the video switch 34. The analog image signals A1 through A3 output from the respective D-A converters 101 through 103 form the respective parts of the resulting analog image signal AV2 and are thereby referred to as 'partial analog image signals'. The partial analog image signals A1 through A3 have three color signals representing the three colors R, G, and B. The video switch 34 accordingly has three switches for the three colors.

As described above, in the image processing apparatus of the embodiment, the reading operation from the frame memory 26 and the D-A conversion are carried out at the frequency that is 1/Nr of the frequency of the dot clock signal DCLK2. The arrangement of this embodiment thus advantageously utilizes relatively low-speed hardware circuits to output the high-frequency analog image signal AV2. Only the sampling clock selection circuit 96 and the video switch 34 are activated in response to the high-frequency dot clock signal DCLK2. In the circuit structure of this embodiment, the required number of circuit elements activated at the high frequency is accordingly minimized. This arrangement allows the relatively simple circuit structure and saves the power consumption.

The read control signal regulation unit 58 (see FIG. 1) sets the working number Nr of the D-A converters (this is equal to the multiplier in the PLL circuit 94) in the CPU interface circuit 98 of the read sampling clock generator 30. The CPU interface circuit 98 sets the multipliers N1 and Nr of the PLL circuits 92 and 94 according to the working number Nr of the D-A converters and generates a sleep signal SLP2 to halt the operation of some of the D-A converters according to the requirements. This arrangement effectively reduces the power consumption required for the D-A conversion.

As described previously, the digital image signals with respect to all the pixels on an identical line are stored at the consecutive addresses in the frame memory 26. This arrangement enables digital image signals to be read from arbitrary positions in the frame memory 26. The working number Nw of the A-D converters may be set independently of the working number Nr of the D-A converters. The total number of installed A-D converters may also be determined independently of the total number of installed D-A converters.

B. Second Embodiment

Figure 5:
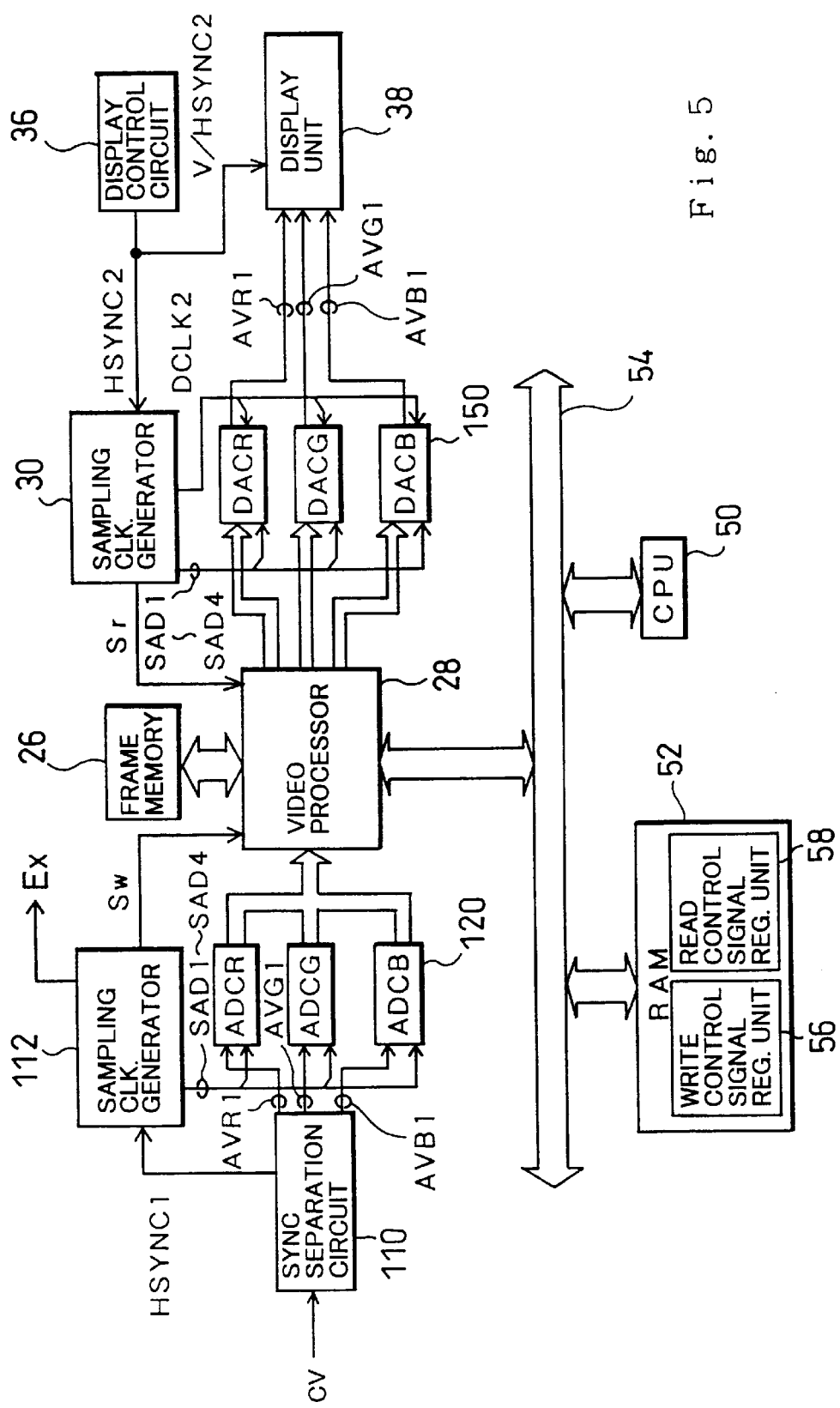
FIG. 5 is a block diagram illustrating the general structure of another image processing apparatus in a second embodiment according to the present invention.

FIG. 5 is a block diagram illustrating the general structure of another image processing apparatus in a second embodiment according to the present invention. This image processing apparatus is constructed as a computer including a synchronizing signal separation circuit 110, a write sampling clock generator 112, an A-D conversion unit 120, the frame memory 26, the video processor 28, the read sampling clock generator 30, a D-A conversion unit 150, the display control circuit 36, the display unit 38, the CPU 50, and the RAM 52. The video processor 28, the CPU 50, and the RAM 52 are mutually connected via the bus 54. The two sampling clock generators 112 and 30 and the display control circuit 36 are also connected to the bus 54, although the connection is omitted from the illustration of FIG. 5. The constituents other than the synchronizing signal separation circuit 110, the write sampling clock generator 112, the A-D conversion unit 120, and the D-A conversion unit 150 are substantially similar to those of the image processing apparatus of the first embodiment, and are thereby not specifically described here.

The synchronizing signal separation circuit 110 causes an input composite image signal CV to separate into synchronizing signals and component image signals (that is, an analog image signal without the synchronizing signals). The synchronizing signal separation circuit 110 further causes the component image signals to separate into three color signals. The synchronizing signals and the three color signals are accordingly output from the synchronizing signal separation circuit 110.

The three color signals separated by the synchronizing signal separation circuit 110 are converted into digital image signal elements respectively by three A-D color signal conversion units 121 through 123 included in the A-D conversion unit 120. Here the 'digital image signal elements' denote respective color signals of the digital image signals, and the three digital image signal elements of R, G, and B are combined into a digital image signal.

Figure 6:
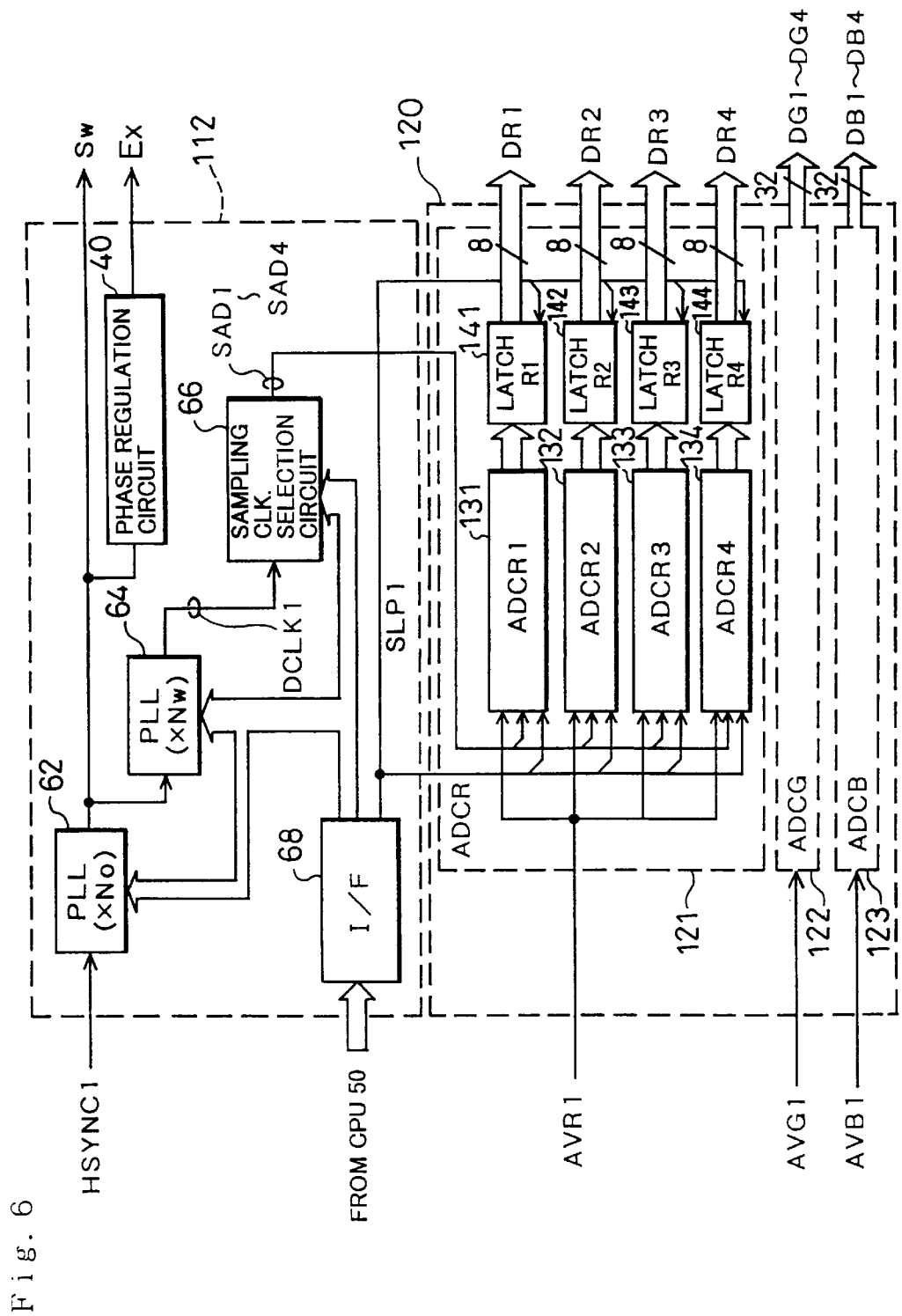
FIG. 6 is a block diagram illustrating the internal structure of the write sampling clock generator 112 and the A-D conversion unit 120.

FIG. 6 is a block diagram illustrating the internal structure of the write sampling clock generator 112 and the A-D conversion unit 120. The write sampling clock generator 112 includes a phase regulation circuit 40 (described later), in addition to the structure of the first embodiment. The A-D conversion unit 120 has the three A-D color signal conversion units 121 through 123. The A-D color signal conversion unit 121 includes four A-D converters 131 through 134 and four latches 141 through 144. The other A-D color signal conversion units 122 and 123 have the same structure.

In the write sampling clock generator 112, the PLL circuit 64 multiplies the write sampling clock signal Sw by four to generate a dot clock signal DCLK1. The sampling clock selection circuit 66 generates four sampling clock signals SAD1 through SAD4. The four sampling clock signals SAD1 through SAD4 have the same frequency as that of the write sampling clock signal Sw and the phases sequentially shifted by the period of the dot clock signal DCLK1.

The A-D color signal conversion unit 121 carries out A-D conversion of one color signal AVR1 among the three color signals of R, G, and B. The color signal AVR1 is commonly input into the four A-D converters 131 through 134 included in the A-D color signal conversion unit 121, while the four sampling clock signals SAD1 through SAD4 are respectively supplied to the four A-D converters 131 through 134. The first A-D converter 131 carries out A-D conversion of the color signal AVR1 with respect to one pixel, based on the first sampling clock signal SAD1. The other A-D converters 132 through 134 carry out similar A-D conversion based on the sampling clock signals SAD2 through SAD4, respectively. The color signals AVR1 with respect to the four pixels arrayed in time series are successively converted at the same period as that of the write sampling clock signal Sw. A digital image signal element DR1 converted by the A-D converter 131 is latched by the first latch 141. Digital image signal elements DR2 through DR4 converted by the other A-D converters 132 through 134 are latched by the latches 142 through 144, respectively.

The processing in the A-D color signal conversion unit 121 is also carried out in the other A-D color signal conversion units 122 and 123. A color signal AVG1 input into the A-D color signal conversion unit 122 undergoes A-D conversion, and converted digital image signal elements DG1 through DG4 are latched by corresponding latches. A color signal AVB1 input into the A-D color signal conversion unit 123 undergoes A-D conversion, and converted digital image signal elements DB1 through DB4 are latched by corresponding latches. The digital image signal elements DR1, DG1, and DB1 are combined into a digital image signal D1 with respect to one pixel. Digital image signals D2 through D4 are composed in a similar manner.

The digital image signals D1 through D4 with respect to four pixels thus obtained are written as one set of 96-bit digital image signals into consecutive storage areas in the frame memory 26 (see FIG. 5) in the same manner as the first embodiment.

Like the first embodiment, the write control signal regulation unit 56 sets the parameters, such as the multipliers N0 and Nw of the PLL circuits 62 and 64, in a non-illustrated register in the CPU interface circuit 68. The multiplier Nw in the PLL circuit 64 is generally set equal to the total number (=4) of the A-D converters included in one A-D color signal conversion unit. When the dot clock signal DCLK1 has a sufficiently low frequency, one to three A-D converters may be sufficient for the A-D conversion. In this case, it is desirable to use only one to three A-D converters for the A-D conversion, in order to reduce the power consumption of the A-D conversion unit 120. By the technique discussed in the first embodiment, this embodiment halts the operation of an arbitrary number of A-D converters and generates the suitable write sampling clock signal Sw.

The image processing apparatus of this embodiment provides the three A-D color signal conversion units 121 through 123 for the three color signals R, G, and B. The three A-D color signal conversion units 121 and 123 are separately integrated into one-chip configurations. The integration of the A-D conversion unit for a certain color into the one-chip configuration effectively reduces a variation in luminance among the pixels with respect to the certain color. The reference voltage for regulating a variation intrinsic to the A-D converters is set for each A-D converter of the one-chip configuration. In the first embodiment, each A-D converter of the one-chip configuration (for example, the A-D converter 71 shown in FIG. 2) has converters for three colors, and digital image signals with respect to three colors are output from the three A-D converters 71 through 73. When the three A-D converters 71 through 73 have different reference voltages, there is a possibility of causing a variation in luminance among the pixels with respect to each color signal. In the structure of the second embodiment, on the other hand, the A-D color signal conversion units 121 through 123 for the respective color signals are integrated into the one-chip configurations, so that the reference voltage is fixed for each color signal. This arrangement effectively interferes with a variation in luminance among the pixels with respect to each color signal.

The phase regulation circuit 40 regulates the phase of the write sampling clock signal Sw, so as to generate an external sampling clock signal Ex that has the same period as that of the write sampling clock signal Sw. The external sampling clock signal Ex has the same period as that of the write sampling clock signal Sw and thereby has the same period as those of the digital image signals D1 through D4. The external sampling clock signal Ex can thus be used as the sampling clock having the phase suitable for a subsequent circuit that processes the digital image signals D1 through D4. Even if the delay of the digital image signals D1 through D4 gives a significant influence on the subsequent circuit, the supply of the external sampling clock signal Ex ensures the adequate sampling.

The phase regulation circuit 40 may be included in the image processing apparatus of the first embodiment. The structure of the first embodiment with the phase regulation circuit 40 has the effects discussed above.

Figure 7:
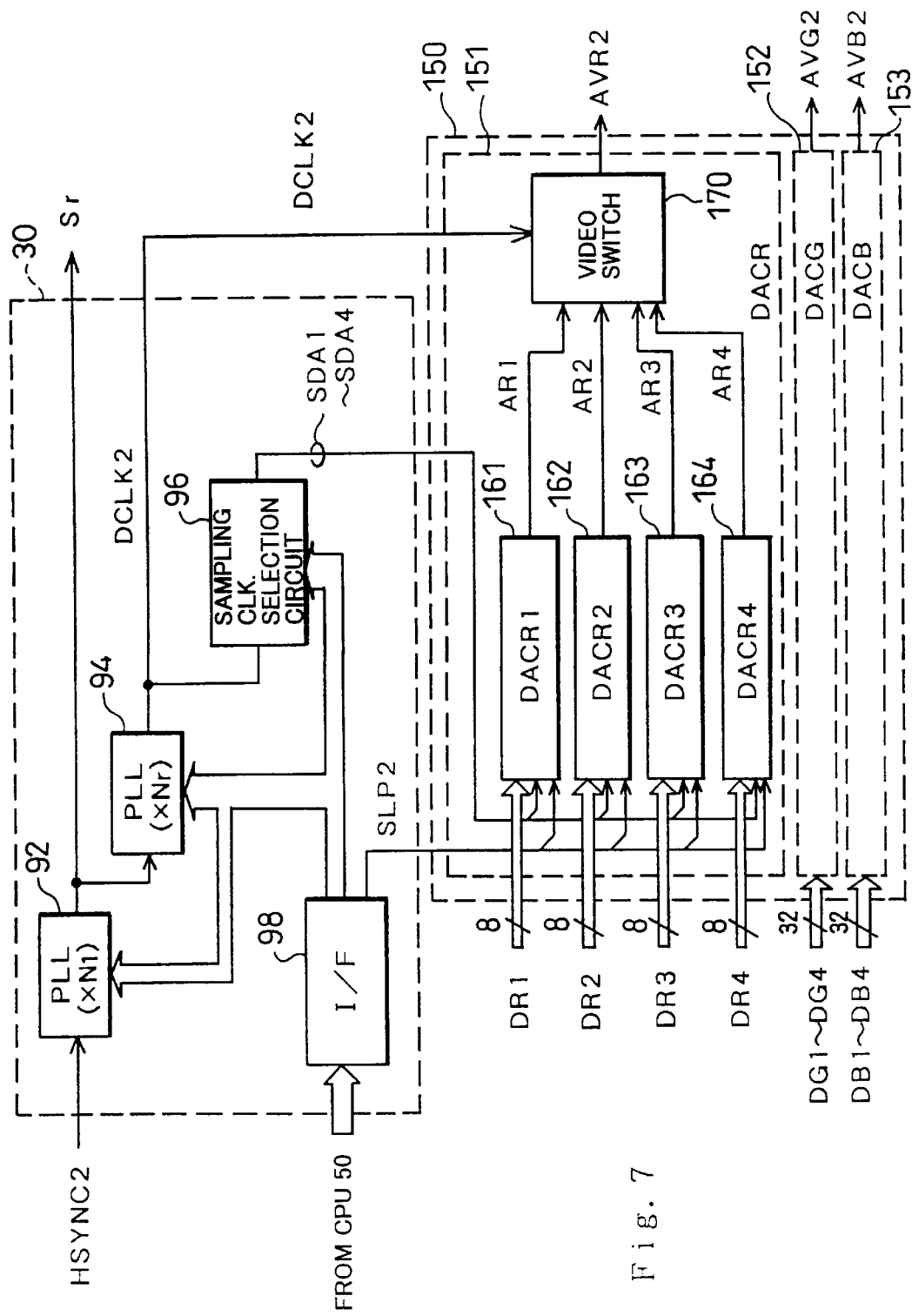
FIG. 7 is a block diagram illustrating the internal structure of the read sampling clock generator 30 and the D-A conversion unit 150.

The digital image signals stored in the frame memory 26 (FIG. 5) are read by the video processor 28 and converted into analog image signals by the D-A conversion unit 150. FIG. 7 is a block diagram illustrating the internal structure of the read sampling clock generator 30 and the D-A conversion unit 150. The read sampling clock generator 30 has the same structure as that of the first embodiment. The D-A conversion unit 150 has three D-A color signal conversion units 151 through 153. The D-A color signal conversion unit 151 includes four D-A converters 161 through 164 and one video switch 170. The other D-A color signal conversion units 152 and 153 have the same structure.

In the read sampling clock generator 30, the PLL circuit 94 multiplies the read sampling clock signal Sr by four to generate a dot clock signal DCLK2. The sampling clock selection circuit 96 generates four sampling clock signals SDA1 through SDA4. The four sampling clock signals SDA1 through SDA4 have the same frequency as that of the read sampling clock signal Sr and the phases sequentially shifted by the period of the dot clock signal DCLK2.

The operation of the four D-A converters 161 through 164 included in the D-A color signal conversion unit 151 is just reverse to the operation of the A-D converters 131 through 134 (FIG. 6). The D-A conversion converts the digital image signal elements DR1 through DR4 respectively into color signals AR1 through AR4. The color signals AR1 through AR4 are input into the video switch 170 and successively selected and output synchronously with the dot clock signal DCLK2. A resulting color signal AVR2 has the original pixel array.

The processing in the D-A color signal conversion unit 151 is also carried out in the other D-A color signal conversion units 152 and 153. The digital image signal elements DG1 through DG4 input into the D-A color signal conversion unit 152 undergo D-A conversion and are output as a color signal AVG2. The digital image signal elements DB1 through DB4 input into the D-A color signal conversion unit 153 undergo D-A conversion and are output as a color signal AVB2.

Like the first embodiment, the read control signal regulation unit 58 sets the parameters, such as the multipliers N1 and Nr of the PLL circuits 92 and 94, in a non-illustrated register in the CPU interface circuit 68. The multiplier Nr in the PLL circuit 94 is generally set equal to the total number (=4) of the D-A converters included in one D-A color signal conversion unit. When the dot clock signal DCLK2 has a sufficiently low frequency, one to three D-A converters may be sufficient for the D-A conversion. In this case, it is desirable to use only one to three D-A converters for the D-A conversion, in order to reduce the power consumption of the D-A conversion unit 150. By the technique discussed in the first embodiment, this embodiment halts the operation of an arbitrary number of D-A converters and generates the suitable read sampling clock signal Sr.

The image processing apparatus of this embodiment has the three DA color signal conversion units 151 through 153 for the three color signals of R, G, and B. The integration of each D-A color signal conversion unit effectively reduces a variation in luminance among the pixels. In the structure of the first embodiment, the reference voltage for regulating a variation intrinsic to the D-A converters is generally set in each of the D-A converters 101 through 103 (FIG. 4) with respect to each pixel. There is accordingly a possibility of causing a variation in luminance among the pixels. The structure of the second embodiment, on the other hand, sets the reference voltage in each of the D-A color signal conversion units 151 through 153 for the respective color signals, so as to interfere with a variation in luminance among the pixels.

In this embodiment, the digital image signals with respect to all the pixels on an identical line are stored at the consecutive addresses in the frame memory 26. This arrangement enables digital image signals to be read from arbitrary positions in the frame memory 26. The working number Nw of the A-D converters may be set independently of the working number Nr of the D-A converters. The total number of installed A-D converters may also be determined independently of the total number of installed D-A converters.

C. Third Embodiment

Figure 8:
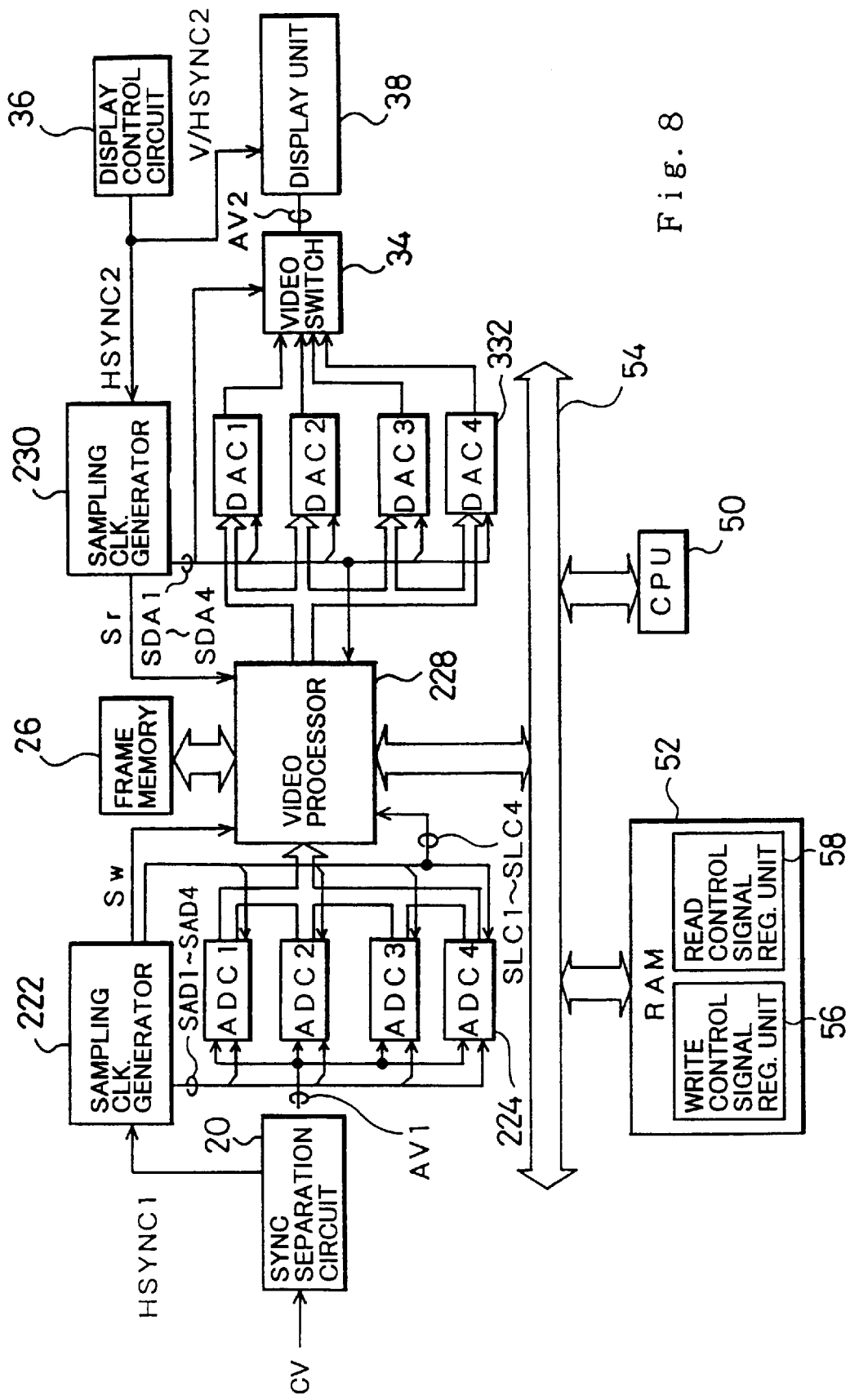
FIG. 8 is a block diagram illustrating the general structure of still another image processing apparatus in a third embodiment according to the present invention.

FIG. 8 is a block diagram illustrating the general structure of still another image processing apparatus in a third embodiment according to the present invention. The structure of this image processing apparatus is substantially similar to the structure of the image processing apparatus shown in FIG. 1. In this embodiment, an A-D conversion unit 224 includes four A-D converters, and a D-A conversion unit 332 includes four D-A converters. The constituents of this embodiment other than a write sampling clock generator 222, the A-D conversion unit 224, and a video processor 228 carry out the operations substantially similar to those of the image processing apparatus shown in FIG. 1 and are not specifically described here.

Figure 9:
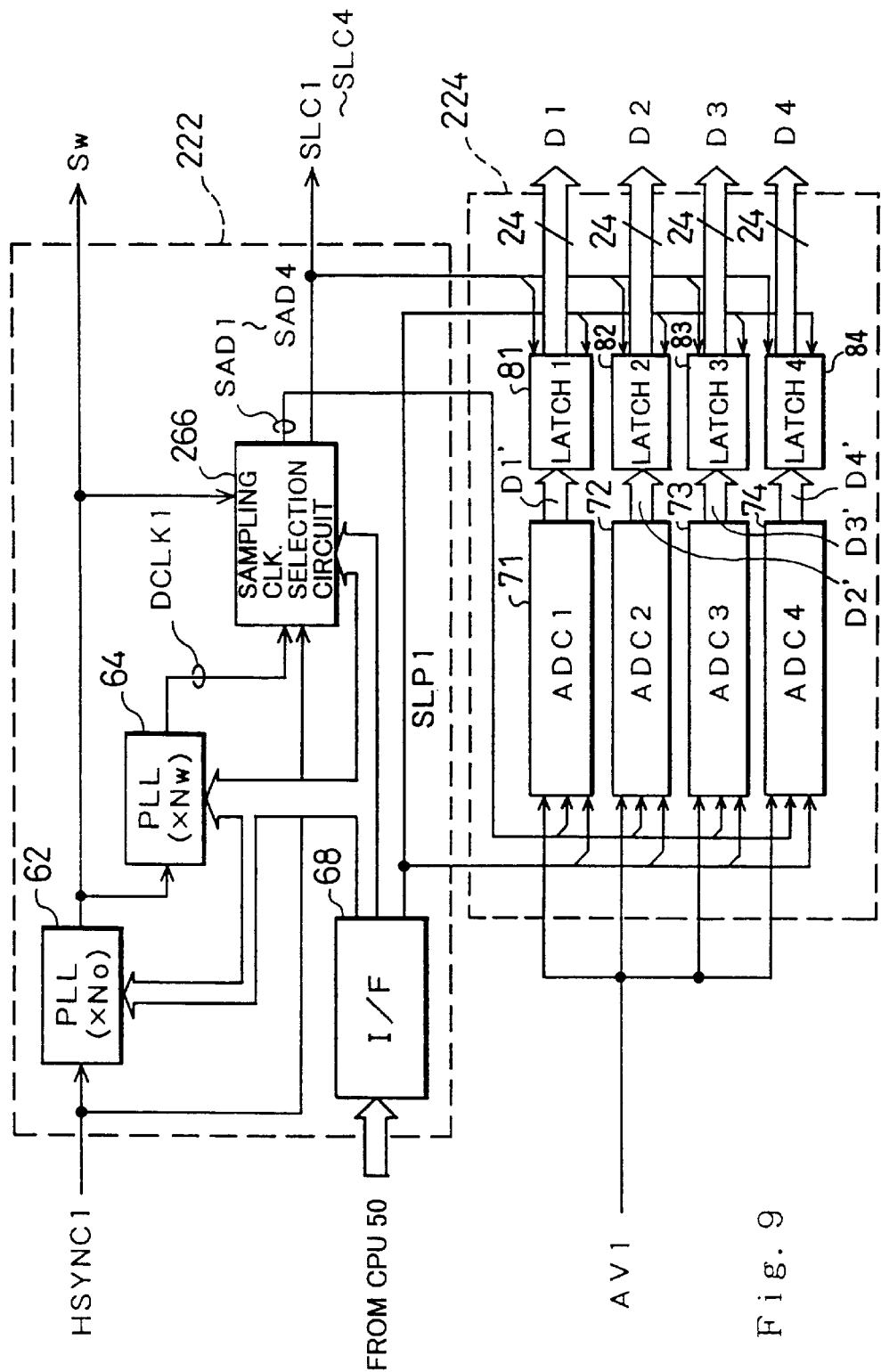
FIG. 9 is a block diagram illustrating the internal structure of the write sampling clock generator 222 and the A-D conversion unit 224 in the third embodiment.

FIG. 9 is a block diagram illustrating the internal structure of the write sampling clock generator 222 and the A-D conversion unit 224 in the third embodiment. The internal structure of the write sampling clock generator 222 is substantially similar to the internal structure of the first embodiment (see FIG. 2). As mentioned above, the A-D conversion unit 224 includes four A-D converters 71 through 74 and four latches 81 through 84. The PLL circuit 62 of this embodiment corresponds to the first original sampling clock generation circuit of the present invention. The PLL circuit 64 and a sampling clock selection circuit 266 correspond to the first sampling clock generation circuit. The PLL circuit 64 and the sampling clock selection circuit 266 also correspond to the first PLL circuit and the first sampling clock extraction circuit of the present invention, respectively.

The sampling clock selection circuit 266 of this embodiment outputs the sampling clock signals SAD1 through SAD4, which will be supplied respectively to the A-D converters 71 through 74, and latch clock signals SLC1 through SLC4, which will be supplied respectively to the latches 81 through 84. The sampling clock selection circuit 266 receives the write sampling clock signal Sw and the horizontal synchronizing signal HSYNC1, in addition to the dot clock signal DCLK1.

Figure 10:
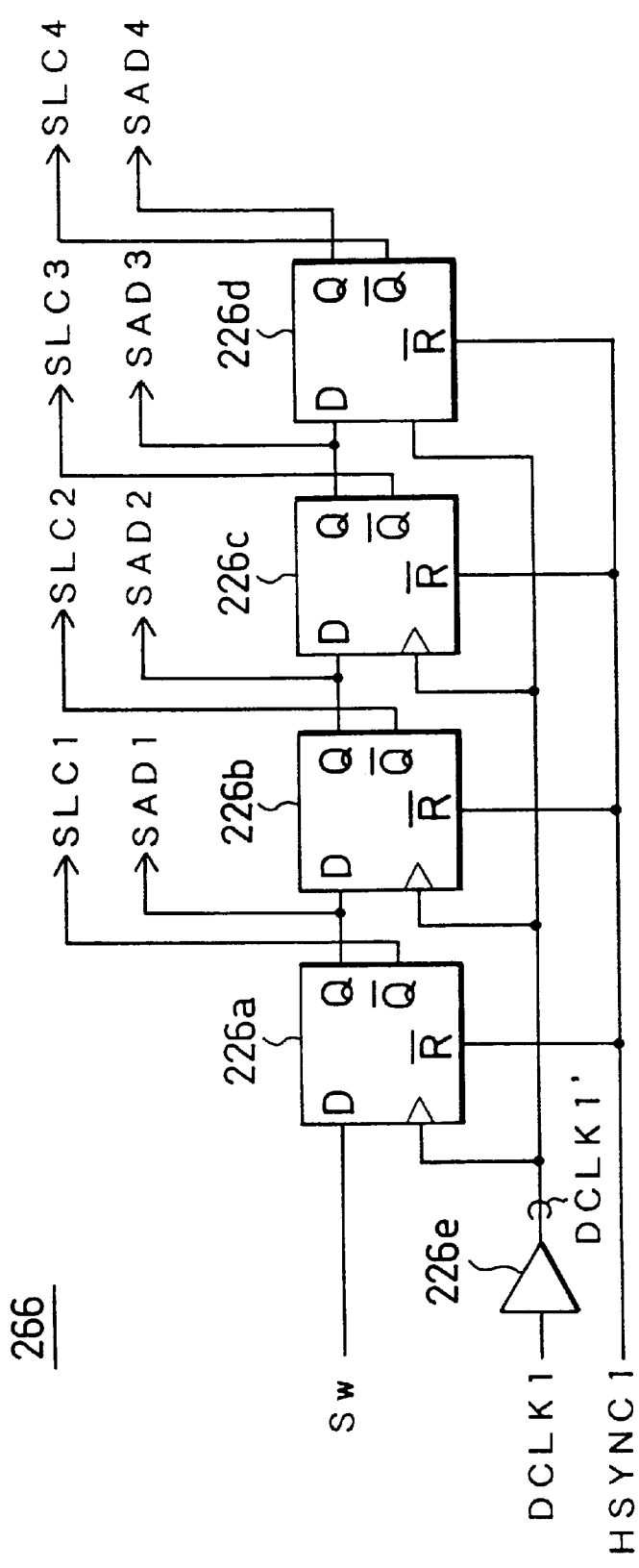
FIG. 10 is a circuit diagram illustrating an exemplified structure of the sampling clock selection circuit 266.

FIG. 10 is a circuit diagram showing an exemplified structure of the sampling clock selection circuit 266. The sampling clock selection circuit 266 includes a shift register, which consists of four D flip-flops 226a through 226d, and a delay circuit 226e. The write sampling clock signal Sw is input into a data input terminal of the first D flip-flop 226a, while the dot clock signal DCLK1 is input into the delay circuit 226e. A dot clock signal DCLK1' output from the delay circuit 226e is commonly input into clock terminals of the four D flip-flops 226a through 226d. The horizontal synchronizing signal HSYNC1 is commonly input into reset terminals of the four D flip-flops 226a through 226d.

Figure 11:
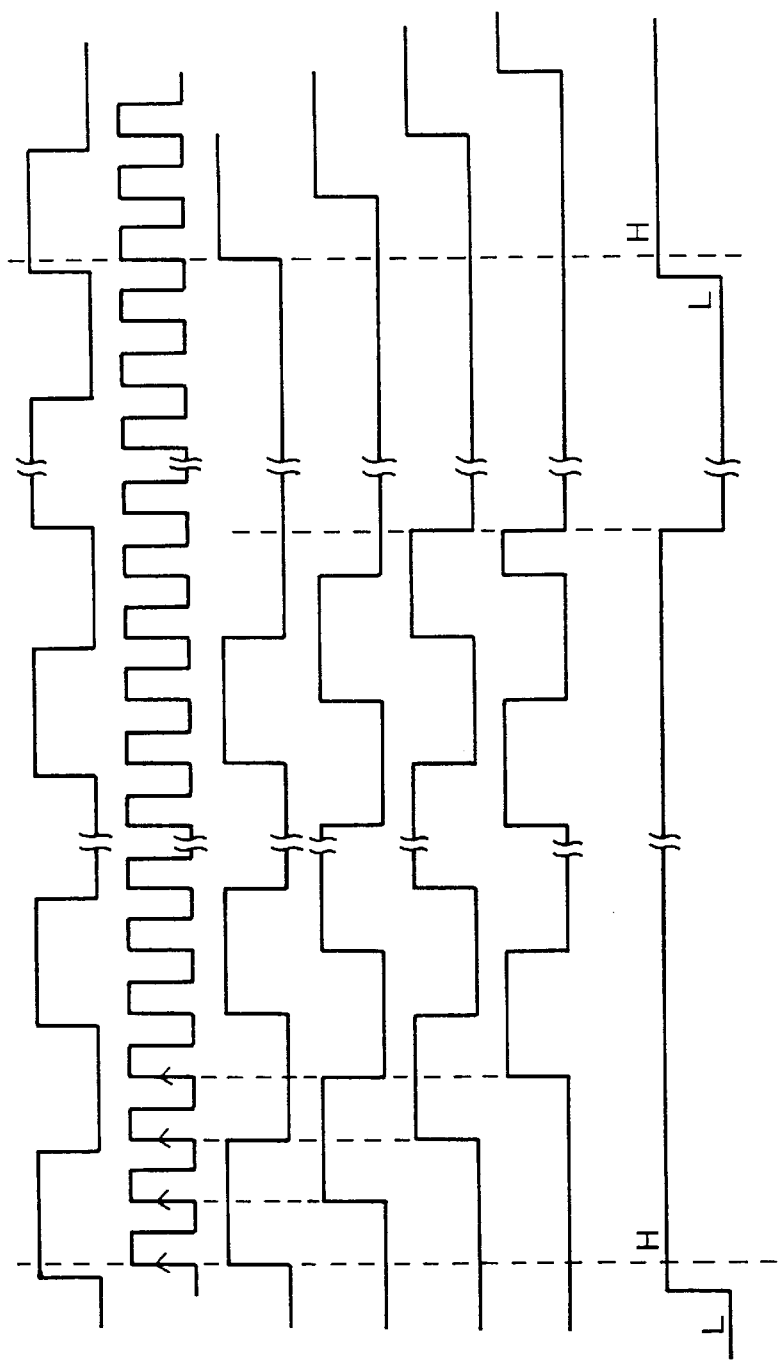
FIGS. 11(a)–11(g) are timing charts showing operations of the sampling clock selection circuit 266.

FIGS. 11(a)–11(g) are timing charts showing the operations of the sampling clock selection circuit 266. The following describes the operations of the sampling clock selection circuit 266 according to the timing chart of FIGS. 11(a)–11(g). The first D flip-flop 226a (see FIG. 10) samples the write sampling clock signal Sw input from its data input terminal at a rising edge of the dot clock signal DCLK1' and outputs a sampling clock signal SAD1. FIGS. 11(a) through 11(c) show the waveforms of the write sampling clock signal Sw, the dot clock signal DCLK1', and the sampling clock signal SAD1. The second D flip-flop 226b samples the sampling clock signal SAD1 (FIG. 11(c)) output from the first D flip-flop 226a at a rising edge of the dot clock signal DCLK1' and outputs a sampling clock signal SAD2. In a similar manner, the D flip-flops 226c and 226d respectively output sampling clock signals SAD3 and SAD4. FIGS. 11(d) through 11(f) show the waveforms of the sampling clock signals SAD2 through SAD4. In this manner, the sampling clock selection circuit 266 outputs the four sampling clock signals SAD1 through SAD4 (FIGS. 11(c) through 11(f)) having the phases sequentially shifted by 90 degrees.

The D flip-flops 226a through 226d change the respective output signals SAD1 through SAD4 to an L level, in response to an input of the L level into their reset terminals. The reset state is cancelled in response to an input of an H level into the reset terminals, and the above operations restart to output the sampling clock signals SAD1 through SDA4. Application of the horizontal synchronizing signal HSYNC1 shown in FIG. 11(g) for the reset signal of the D flip-flops holds fixed phase relationships between the horizontal synchronizing signal HSYNC1 and the four sampling clock signals SAD1 through SAD4.

The supplies of the sampling clock signals SAD1 through SAD4 into the A-D converters 71 through 74 (FIG. 9) enable the first A-D converter 71 to always carry out A-D conversion of an image signal with respect to a head pixel on each horizontal line. In the case where no reset operation is carried out in response to the horizontal synchronizing signal HSYNC1, there is no fixed A-D converter used for conversion of the image signal with respect to the first pixel present on one horizontal line. The A-D converter used for the conversion may accordingly be changed for each horizontal line. The arrangement of this embodiment, on the other hand, enables the first A-D converter 71 to always carry out conversion of the first pixel signal. The reset signal is not restricted to the horizontal synchronizing signal HSYNC1 shown in FIG. 11(g), but may be another signal having a pulse that holds a fixed phase relation to the pulse of the horizontal synchronizing signal HSYNC1.

The sampling clock signals SAD1 through SAD4 output from inversion output terminals of the D flip-flops 226a through 226d as shown in FIG. 10 may be utilized as the latch clock signals SLC1 through SLC4. In this embodiment, the output latch clock signals SLC1 through SLC4 have the phases shifted by 180 degrees from the respective phases of the sampling clock signals SAD1 through SAD4. As clearly understood from this explanation, the PLL circuit 64 and the sampling clock selection circuit 266 of this embodiment correspond to the second sampling clock generation circuit of the present invention. Although the first sampling clock generation circuit also works as the second sampling clock generation circuit in this embodiment, one possible modification has the second sampling clock generation circuit provided independently.

Figure 12:
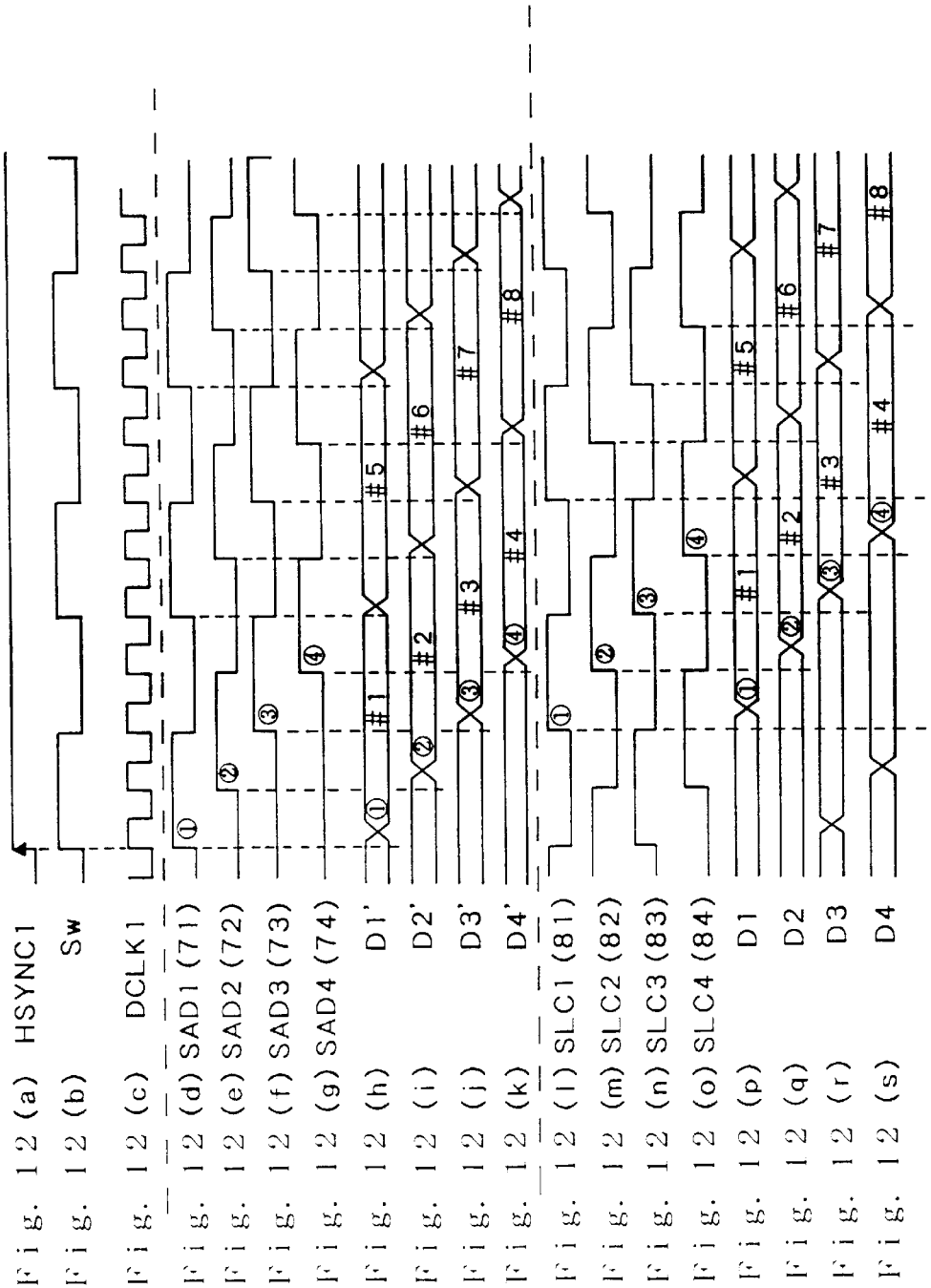
FIGS. 12(a)–12(s) are timing charts showing the outputs of the digital image signals D1 through D4.

FIGS. 12(a)–12(s) are timing charts showing the outputs of the digital image signals D1 through D4 in the third embodiment. FIGS. 12(a) through 12(c) show the waveforms of the horizontal synchronizing signal HSYNC1, the write sampling clock signal Sw, and the dot clock signal DCLK1. FIGS. 12(d) through 12(g) show the waveforms of the sampling clock signals SAD1 through SAD4. The analog image signal AV1 input into the A-D converters 71 through 74 (FIG. 9) undergoes A-D conversion at respective rising edges of the four sampling clock signals SAD1 through SAD4 (FIGS. 12(d) through 12(g)) having the sequentially shifted phases. The numeral in the brackets given after the signal name, for example, (71) given after SAD1 in FIG. 12(d), shows that the clock signal input into the A-D converter 71 is the sampling clock signal SAD1. The analog image signal AV1 undergoes the A-D conversion carried out by the A-D converters 71 through 74 and is output as digital image signals D1' through D4'. FIGS. 12(h) through 12(k) show the digital image signals D1' through D4'. The signals D1' through D4' are input into the latches 81 through 84 (FIG. 9) and latched in response to the latch clock signals SLC1 through SLC4. Four digital image signals D1 through D4 latched by the latches 81 through 84 are output as data having the phases sequentially shifted by 90 degrees. FIGS. 12(l) through 12(o) show the waveforms of the latch clock signals SLC1 through SLC4. FIGS. 12(p) through 12(s) show the digital image signals D1 through D4 output in response to the latch clock signals SLC1 through SLC4.

In the example of FIGS. 12(a)–12(s), the sampling clock signals SAD1 through SAD4 are respectively supplied to the A-D converters 71 through 74, and the A-D converters are activated in the sequence of 71, 72, 73, 74 for A-D conversion. One possible modification changes the A-D converters that receive the four sampling clock signals SAD1 through SAD4, in order to change the sequence of activating the A-D converters.

Figure 13:
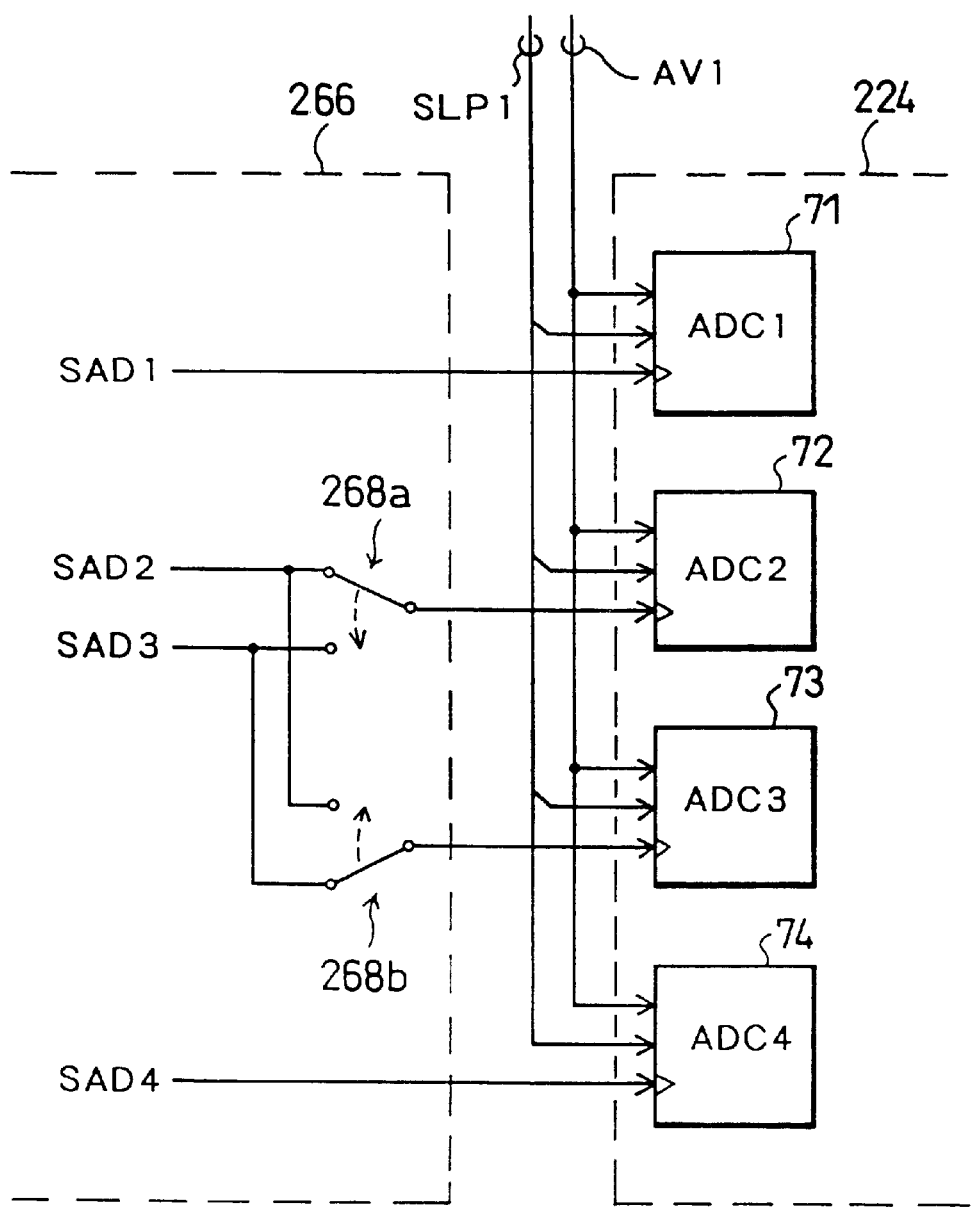
FIG. 13 shows an exemplified structure of a sampling clock switching circuit for changing the A-D converters, to which the sampling clock signals SAD1 through SAD4 are supplied.

FIG. 13 shows an exemplified structure of a sampling clock switching circuit 268 for changing the A-D converters, to which the sampling clock signals SAD1 through SAD4 are supplied. In this embodiment, this switching circuit is disposed inside the sampling clock selection circuit 266 and has two switches 268a and 268b. Simultaneous switching operations of the two switches 268a and 268b enable each of the sampling clock signals SAD2 and SAD3 to be supplied arbitrarily into either of the A-D converters 72 and 73. In this case, a latch clock switching circuit is also required to change the latches, to which the four latch clock signals SLC1 through SLC4 are supplied. The latch clock switching circuit has a similar structure to that of the sampling clock switching circuit 268 and is thereby not specifically illustrated. The sampling clock switching circuit 268 of this embodiment corresponds to the first switching circuit of the present invention, and the latch clock switching circuit corresponds to the second switching circuit of the present invention. The sleep signal SLP1 supplied to the A-D converters 71 through 74 will be discussed later.

Figure 14:
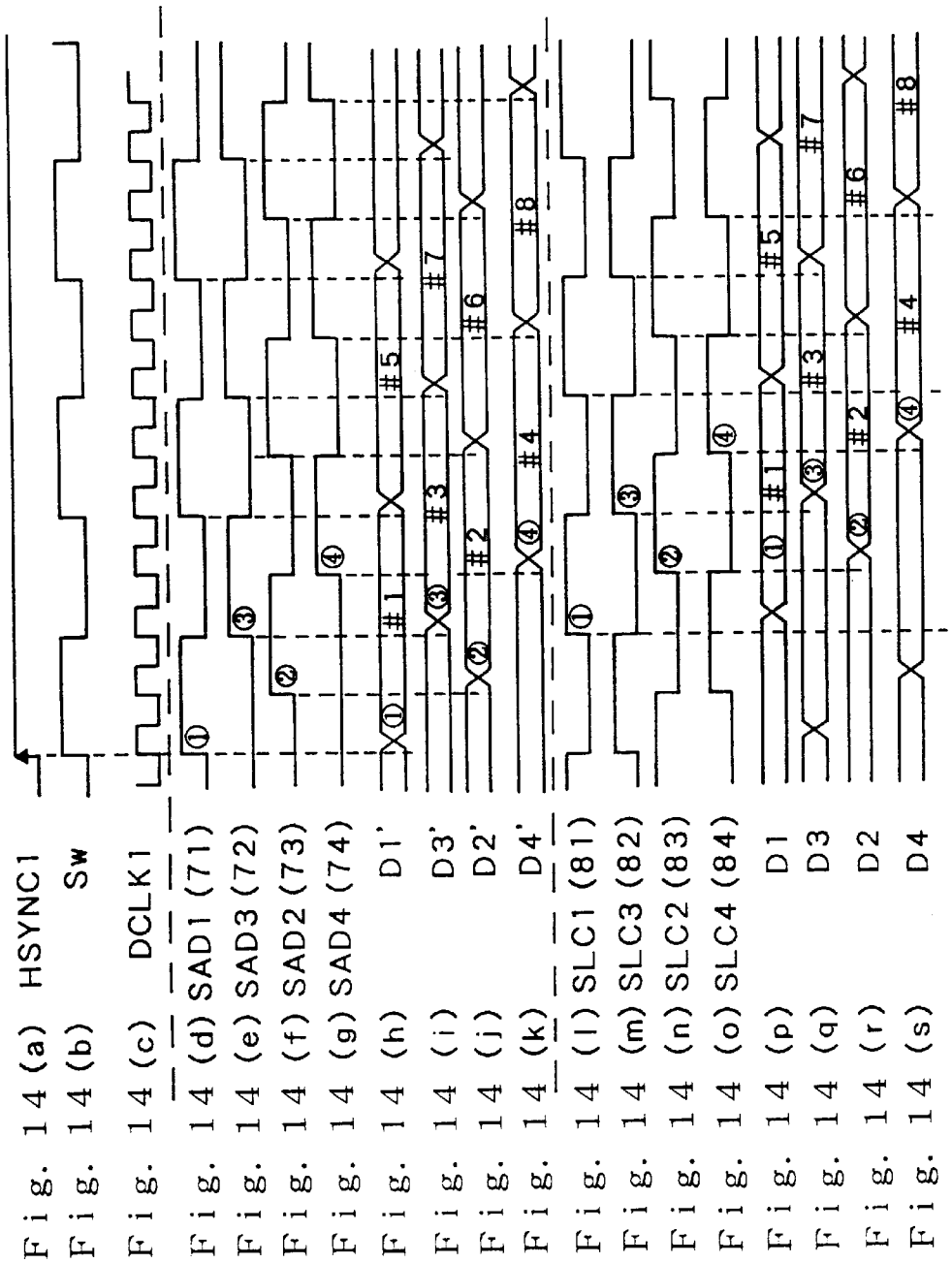
FIGS. 14(a)–14(s) are timing charts showing the outputs of the digital image signals D1 through D4 in the case where the A-D converters of destination, to which the sampling clock signals SAD1 through SAD4 are supplied, are changed.

FIGS. 14(a)–14(s) are timing charts showing the outputs of the digital image signals D1 through D4 in the case where the A-D converters of destination, to which the sampling clock signals SAD1 through SAD4 are supplied, are changed. FIGS. 14(a) through 14(c) show the waveforms of the horizontal synchronizing signal HSYNC1, the write sampling clock signal Sw, and the dot clock signal DCLK1. FIGS. 14(d) through 14(g) show the waveforms when the sampling clock signals SAD1 through SAD4 are supplied respectively to the A-D converters 71, 73, 72, and 74. As shown in FIGS. 14(l) through 14(o), the destinations of the latch clock signals SLC1 through SLC4 are changed like the sampling clock signals SAD1 through SAD4. When the A-D converters of destination of the sampling clock signals are changed, the two switching circuits are set to hold a fixed phase relationship between the sampling clock signal and the latch clock signal, which are supplied to the corresponding A-D converter and latch (for example, the A-D converter 71 and the latch 81). When such change is implemented, the digital image signals D1 through D4 having the sequentially shifted phases are output as shown in FIGS. 14(p) through 14(s). This arrangement enables the digital image signals D1 through D4 to be output according to the specification of the receivers.

The sleep signal SLP1 shown in FIG. 13 is used to halt the operation of some of the four A-D converters 71 through 74. For example, the sleep signal SLP1 is supplied to the two A-D converters, when it is desired to halt the operation of two of the four A-D converters 71 through 74.

Figure 15:
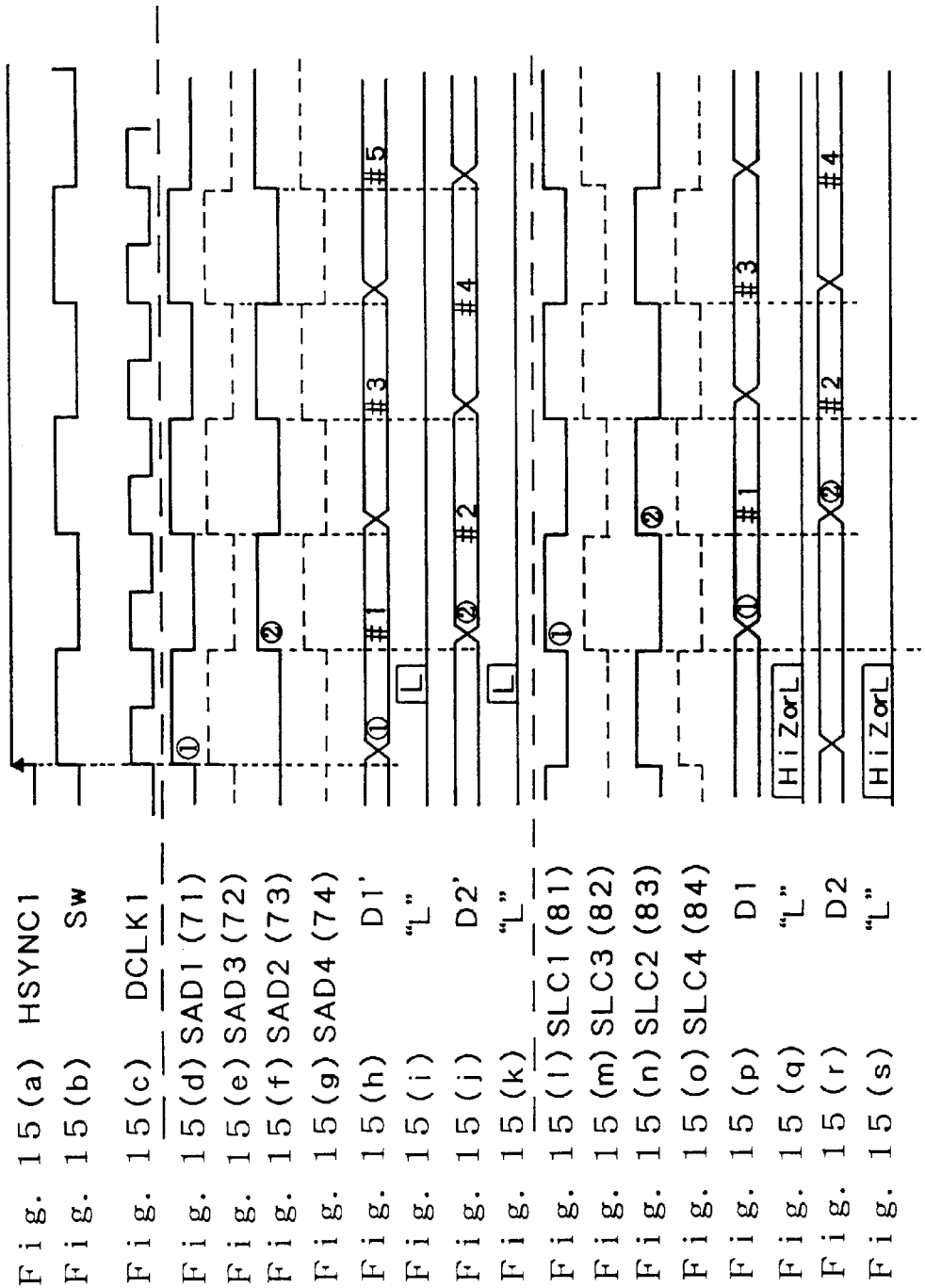
FIGS. 15(a)–15(s) are timing charts in the case where two of the four A-D converters 71 through 74 halt the operation.

FIGS. 15(a)–15(s) are timing charts showing the outputs of the digital image signals D1 through D4 in the case where two of the four A-D converters 71 through 74 are stopped. This timing chart shows the state, in which the sampling clock signal SAD2 is supplied to the A-D converter 73 by the switching operation of the switches 268a and 268b shown in FIG. 13. The write sampling clock signal Sw and the dot clock signal DCLK1 are regulated by changing the values N0 and Nw in the two PLL circuits 62 and 64 (see FIG. 9) as described in the first embodiment. FIGS. 15(a) through 15(c) show the waveforms of the horizontal synchronizing signal HSYNC1, the write sampling clock signal Sw, and the dot clock signal DCLK1. In the sampling clock selection circuit 266 shown in FIG. 10, two sampling clock signals SAD1 and SAD2, which have the phases different from each other by 180 degrees, are generated in response to the sampling clock signal Sw and the dot clock signal DCLK1, and supplied to the A-D converters 71 and 73. FIGS. 15(d) and 15(f) show the waveforms of the sampling clock signals SAD1 and SAD2. In the sampling clock selection circuit 266, non-required signals SAD3 and SAD4 (see FIGS. 15(e) and 15(g)), which respectively have the same phases as those of the sampling clock signals SAD1 and SAD2, are generated and supplied to the A-D converters 72 and 74. The sleep signal SLP1 has, however, been supplied to the A-D converters 72 and 74, and thereby no conversion process is carried out there (see FIGS. 15(i) and (k)). The non-required signals SAD3 and SAD4 may alternatively be processed inside the sampling clock selection circuit 266 (FIG. 9). In this case, the sleep signal SLP1 is supplied to the sampling clock selection circuit 266.

The phase relationship between the two sampling clock signals SAD1 and SAD2, which have a phase difference of 180 degrees as shown in FIGS. 15(d) and 15(f), is equivalent to the phase relationship between the sampling clock signals SAD1 and SAD3 shown in FIGS. 12(d) and 12(f) in the case where all the four A-D converters are activated. Even when the working number of the A-D converters is varied, the switching operation of the switches 268a and 268b enables a sampling clock signal having the phase shifted by 180 degrees from the phase of the sampling clock signal SAD1 to be supplied to the A-D converter 73.

Like the sampling clock signals SAD1 and SAD2, the supply of the latch clock signals SLC1 and SLC2 (see FIGS. 15(l) and 15(m)) to the latches 81 and 83 enables the output digital image signals D1 and D2 (see FIGS. 15(p) and 15(r)) to have the same phase relationship as that of FIGS. 12(p) and 12(r). This also enables the digital image signals D1 through D4 to be output according to the specification of the receivers.

The digital image signals D1 through D4 output from the A-D conversion unit 224 (FIG. 9) have the sequentially shifted phases as mentioned previously. The four digital image signals D1 through D4 are input into the video processor 228 shown in FIG. 8.

Figure 16:
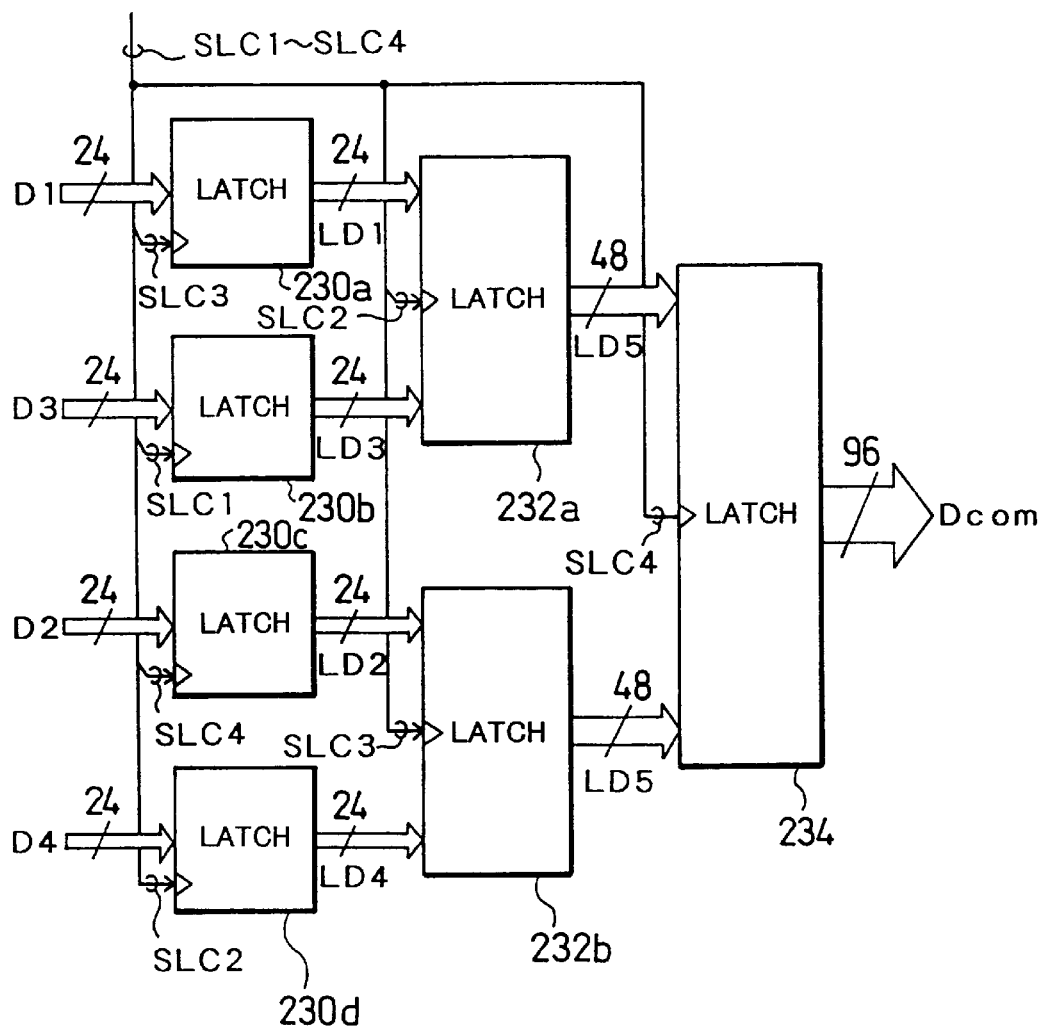
FIG. 16 is a block diagram illustrating a group of digital image signal phase regulation circuits included in the interface unit inside the video processor 228.

FIG. 16 is a block diagram showing a group of digital image signal phase regulation circuits included in the interface unit inside the video processor 228. The group of digital image signal phase regulation circuits includes plural stages of digital image signal phase regulation circuits, which have a hierarchical structure, in which the number of circuits included in each stage gradually degeases towards a last stage. A plurality of digital image signal phase regulation circuits included in each stage, except the last stage, latch a plurality of input digital image signals in fixed phases, which are different from one another, and supply the latched digital image signals to digital image signal phase regulation circuits included in a next stage. A digital image signal phase regulation circuit included in the last stage latches the Nw digital image signals supplied from a previous stage in an identical phase.

The digital image signal phase regulation circuits included in each stage are actualized by latches. One of the latch clock signals SLC1 through SLC4 generated by the sampling clock selection circuit 266 shown in FIG. 9 is input into each latch.

Four latches 230a through 230d in the first stage are used to input the digital image signals D1 through D4, which are output from the A-D conversion unit 224 and have the sequentially shifted phases, into the video processor 228. Each of two latches 232a and 232b in the second stage combines the alternate two signals among the four digital image signals D1 through D4, which are output from the four latches in the first stage and have the sequentially shifted phases, and outputs a composite digital image signal. A latch 234 in the third stage further combines the two composite digital image signals, which are combined respectively by the two latches 232a and 232b in the second stage and have the different phases, and outputs a final set of digital image signals Dcom having an identical phase.

Figure 17:
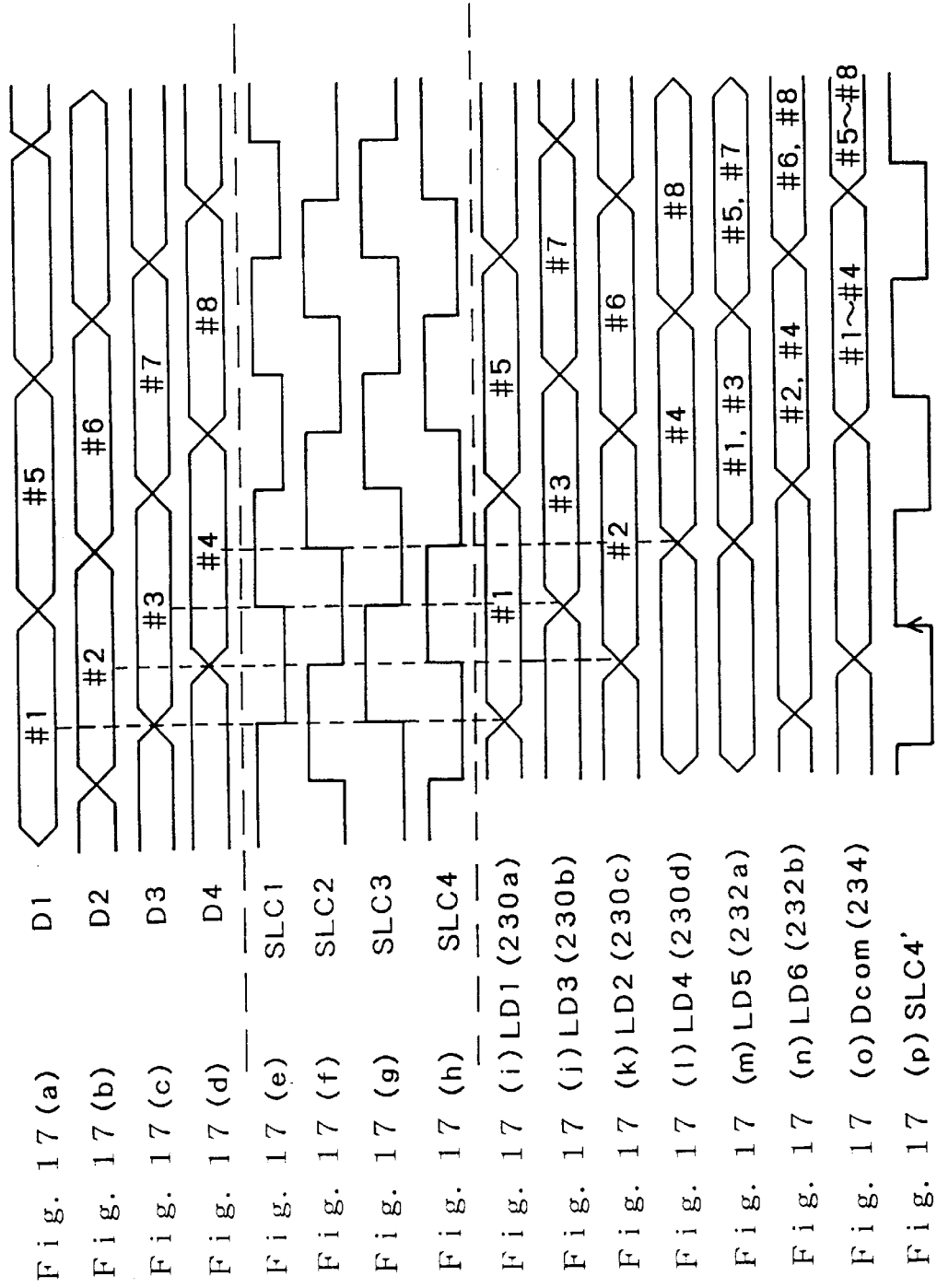
FIGS. 17(a)–17(p) are timing charts showing the digital image signals D1 through D4 when the group of digital image signal phase regulation circuits of FIG. 16 is applied.

FIGS. 17(a)–17(s) are timing charts showing the digital image signals D1 through D4 when the group of digital image signal phase regulation circuits of FIG. 16 is applied. FIGS. 17(a) through 17(d) show the four digital image signals D1 through D4, which are output from the A-D conversion unit 224 shown in FIGS. 12 and 14 and have the sequentially shifted phases. FIGS. 17(e) through 17(h) show the waveforms of the latch clock signals SLC1 through SLC4 input into the video processor 228.

The digital image signals D1, D3, D2, and D4 are respectively input into the latches 230a through 230d in the first stage shown in FIG. 16. The latch 230a samples the digital image signal D1 in response to the latch clock signal SLC3, and outputs a digital image signal LD1 having the phase shifted by 180 degrees from that of the digital image signal D1. In a similar manner, the latches 230b through 230d respectively output digital image signals LD3, LD2, and LD4 in response to the latch clock signals SLC1, SLC4, and SLC2. FIGS. 17(i) through 17(l) show the digital image signals LD1, LD3, LD2, and LD4 output from the latches 230a through 230d.

The latch 232a in the second stage receives the alternate two signals, that is, the digital image signals LD1 and LD3, among the four digital image signals LD1 through DL4 having the sequentially shifted phases. The latch 232a samples the digital image signals LD1 and LD3 at a rising edge of the latch clock signal SLC2 and outputs a composite digital image signal LD5 including the data of the digital image signals LD1 and LD3. In a similar manner, the latch 232b samples the digital image signals LD2 and LD4 in response to the latch clock signal SLC3 and outputs a composite digital image signal LD6 including the data of the digital image signals LD2 and LD4. FIGS. 17(m) and 17(n) show the composite digital image signals LD5 and LD6 respectively output from the latches 232a and 232b.

The two composite digital image signals LD5 and LD6 having the different phases are input into the latch 234 in the third stage. The latch 234 samples the composite digital image signals LD5 and LD6 in response to the latch clock signal SLC4 and outputs the final set of digital image signals Dcom including the data of the digital image signals LD1 through LD4 (see FIG. 17(o)). The use of the latches in the plural stages enable the digital image signals D1 through D4 to be output as the set of digital image signals Dcom of identical phase.

The structure with the latches in the plural stages successively combines the signals of different phases arranged at some intervals and outputs signals of identical phase, thereby ensuring the stable sampling. In this structure, the variation points of data in the respective digital image signals, which are the object of composition, are sufficiently apart from the sampling point for composition (that is, a rising edge of the latch clock signal) in each latch. This lowers the possibility of sampling the respective digital image signals at the variation points of data in the digital image signals. For example, when the four digital image signals D1 through D4 (FIGS. 17(a) through 17(d)) having the sequentially shifted phases are input, all the signals D1 through D4 may be sampled at once at a rising edge of a signal SLC4' (FIG. 17(p)), which has the phase delayed by 90 degrees from that of the latch clock signal SLC4, and output as signals of identical phase. In this case, however, the distances between the sampling point (that is, a rising edge of the latch clock signal SLC4') and the variation points of data in the digital image signals D1 and D4 are as small as ⅛ of the respective periods of the digital image signals D1 and D4. In the structure that successively samples the alternate signals of different phases with the latches in the plural stages as shown in FIG. 16, for example, that samples the digital image signals LD1 and LD3 (see FIGS. 17(i) and 17(j)) in response to the latch clock signal SLC2, on the other hand, the distances between the sampling point (that is, a rising edge of the latch clock signal SLC2) and the variation points of data in the two signals LD1 and LD3 can be expanded to ¼ of the respective periods of the signals LD1 and LD3.

In this embodiment, the latch clock signals SLC1 through SLC4 are supplied to the video processor 228, as well as to the A-D conversion unit 224 as described previously. This arrangement ensures sampling at the adequate timings for the digital image signals D1 through D4 output from the A-D conversion unit 224. Even when there is a variation in delay among the respective clock signals due to the working temperature, this arrangement effectively prevents the wrong operation caused by the variation.

The digital image signal phase regulation circuits are disposed inside the video processor 228 in this embodiment, but may be arranged inside the A-D conversion unit 224. In the latter case, the digital image signals D1 through D4 can be output as the set of digital image signals Dcom of identical phase from the A-D conversion unit 224. It is accordingly not required to supply all the latch clock signals SLC1 through SLC4 to the video processor 228. In this case, it is preferable to supply at least one of the latch clock signals SLC1 through SLC4, in order to sample the set of digital image signals Dcom in the video processor 228.

The set of digital image signals Dcom input into the video processor 228 is stored into the frame memory 26 as discussed in the first embodiment.

The first through the third embodiments generate the clock signals, which are suitable for sampling the respective pixels of the analog image signal AV1, by utilizing the dot clock signal DCLK1 generated from the horizontal synchronizing signal HSYNC1. The dot clock signal DCLK1 has a relatively high frequency. Transfer of the dot clock signal DCLK1 via the wiring formed on the printed board may cause a significant turbulence of the waveform or a delay. It is accordingly desirable to generate and utilize the dot clock signal DCLK1 inside the integrated chip and not to output the dot clock signal DCLK1 to the outside of the integrated chip.

In the structure of the third embodiment, the sampling clock generator 222 and the A-D conversion unit 224 are integrated into one-chip configuration, which effectively prevents the above problem. Even when all the constituents of the sampling clock generator 222 and the A-D conversion unit 224 are not integrated into the one-chip configuration, it is preferable to integrate at least the PLL circuit 64 and the sampling clock selection circuit 266 into one-chip configuration, in order to prevent the dot clock signal DCLK1 from being output to the outside of the integrated chip.

The digital image signals stored in the frame memory 26 are read by the video processor 228, undergo D-A conversion, and are output as an analog image signal AV2. This operation is just reverse to the operation of A-D conversion and not specifically described here.

The internal structure of the write sampling clock generator 222 described in this embodiment is also applicable to the read sampling clock generator 230.

As shown in FIG. 8, the sampling clock signals SDA1 through SDA4 used for D-A conversion are generated by the read sampling clock generator 230 and are input into the D-A conversion unit 332 as well as the video processor 228. In the same manner as the case of inputting the latch clock signals SLC1 through SLC4 into the video processor 228, the D-A conversion can be carried out at the timing suitable for the Nr digital image signals output from the video processor.

The partial analog image signals, which have undergone the D-A conversion carried out in the D-A conversion unit 332; are successively selected by the video switch 34 and combined into one analog image signal AV2. In this embodiment, the sampling clock signals SDA1 through SDA4, instead of the dot clock signal DCLK2, are supplied to the video switch 34 as shown in FIG. 8. In this case, the video switch 34 performs the switching operation by taking advantage of the sequential phase shift of the respective clock signals.

Like in the case of A-D conversion, it is preferable to integrate the sampling clock generator 230 and the D-A conversion unit 332 into one-chip configuration in the case of D-A conversion. When the video switch 34 is activated in response to the dot clock signal DCLK2, it is desirable to further integrate the video switch 34 with the read sampling clock generator 230 and the D-A conversion unit 332. In the structure of FIG. 8, the dot clock signal DCLK2 having a relatively high frequency is not required to be output to the outside of the read sampling clock generator 230. This ensures the stable switching operation of the video switch 34 without the integration.

D. Fourth Embodiment

Figure 18:
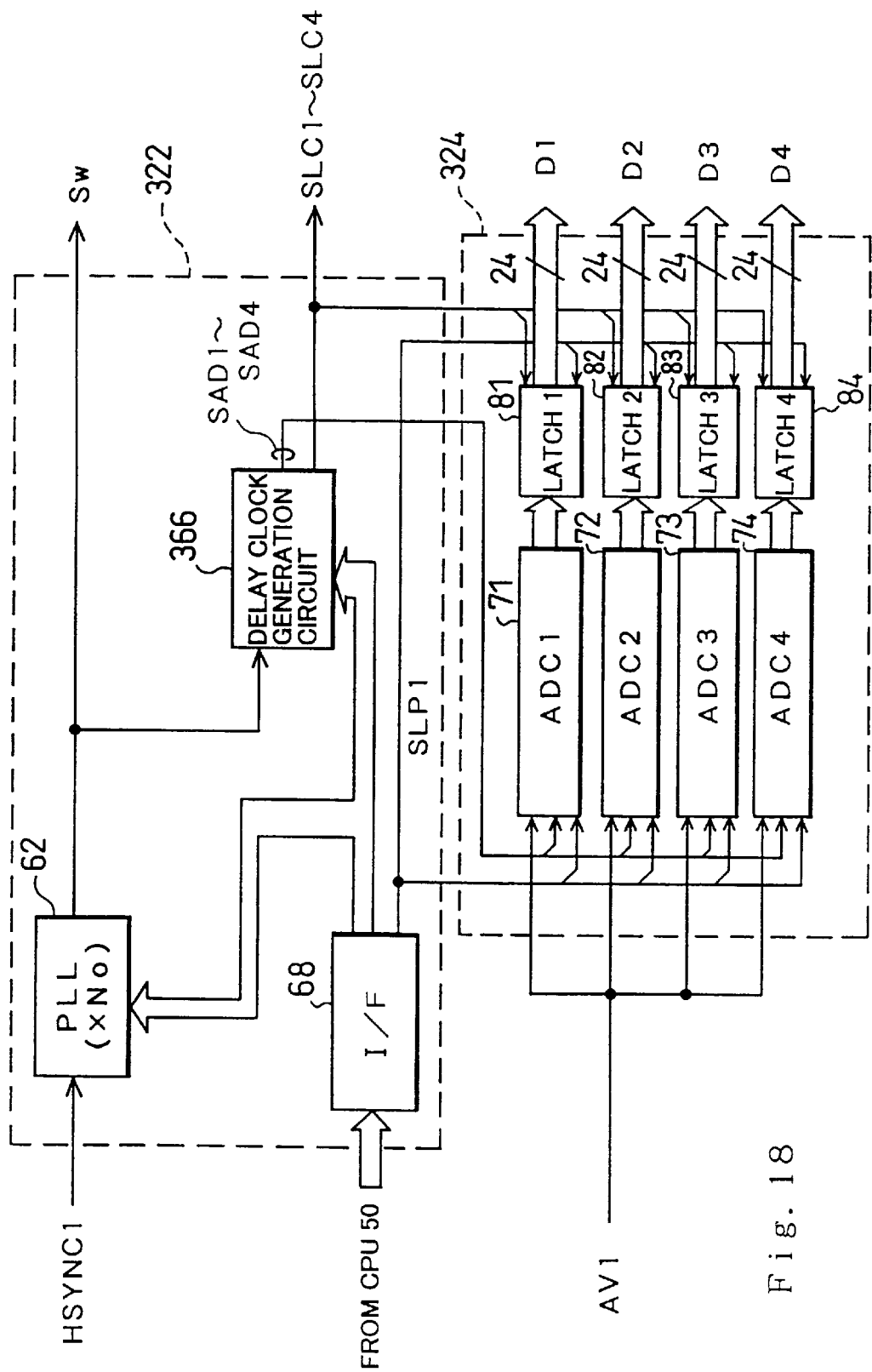
FIG. 18 is a block diagram illustrating the internal structure of a write sampling clock generator 322 and an A-D conversion unit 324 in a fourth embodiment.
Figure 19:
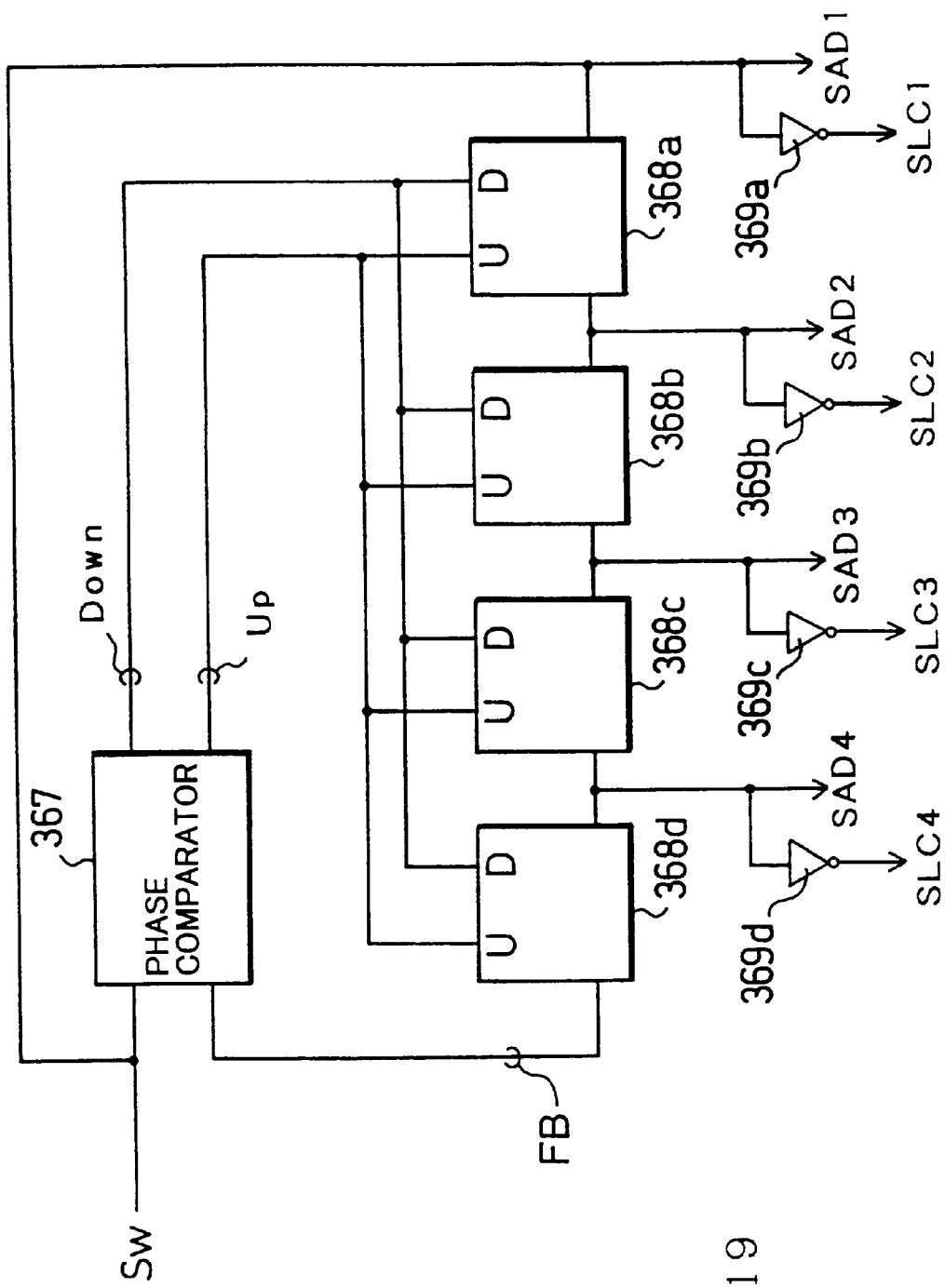
FIG. 19 is a block diagram illustrating the internal structure of a delay clock generation circuit 366.

FIG. 18 is a block diagram illustrating the internal structure of a write sampling clock generator 322 and an A-D conversion unit 324 in a fourth embodiment. The general structure of an image processing apparatus of the fourth embodiment is substantially similar to that of the third embodiment shown in FIG. 8. This embodiment, however, uses a delay clock generation circuit 366, in place of the PLL circuit 64 and the sampling clock selection circuit 266 shown in FIG. 9. The PLL circuit 62 of this embodiment accordingly corresponds to the first original sampling clock generation circuit of the present invention, and the delay clock generation circuit 366 corresponds to the first sampling clock generation circuit. FIG. 19 is a block diagram illustrating the internal structure of the delay clock generation circuit 366. The delay clock generation circuit includes a phase comparator 367 and four delay circuits 368a through 368d. Each of the delay circuits 368a through 368d includes an Up/Down counter and a delay regulation circuit, neither of which is illustrated. The delay regulation circuit may be, for example, a plurality of delay regulation buffers arranged in series.

The phase comparator 367 compares the phases of two input signals with each other and outputs an Up/Down signal according to the phase difference. The write sampling clock signal Sw output from the PLL circuit 62 and a feedback signal FB output from the delay circuit 368d.

The Up/Down counter included in the delay circuits 368a through 368d varies an output of the counter according to the Up/Down signal output from the phase comparator 367. The output of the counter is used to regulate the delay amount by the delay regulation circuit. By way of example, when the Up signal is output to increase the counter output, the working number of the delay regulation buffers is raised to increase the delay amount. When the Down signal is output to decrease the counter output, on the other hand, the working number of the delay regulation buffers is reduced to decrease the delay amount. In this manner, the delay amounts are regulated in the four delay circuits 368a through 368d.

The write sampling clock signal Sw input into the delay circuit 368a passes through the four delay circuits 368a through 368d and is input as the feedback signal FB, which is delayed by substantially one period from the write sampling clock signal Sw, into the phase comparator 367. The phase comparator 367 outputs an Up/Down signal again according to the phase difference between the two signals Sw and FB. This structure regulates the phases of the two signals Sw and FB and enables the write sampling clock signal Sw and the three signals output from the delay circuits 368a through 368c to be output as the sampling clock signals SAD1 through SAD4 from the delay clock generation circuit 366. The sampling clock signals SAD1 through SAD4 have the phases sequentially shifted by every 90 degrees. The sampling clock signals SAD1 through SAD4 are inverted by inverters 369a through 369d and output as the latch clock signals SLC1 through SLC4.

Although the write sampling clock signal Sw is used as the sampling clock signal SAD1 in the example of FIG. 19, the signals output from the four delay circuits 368a through 368d may be used as the sampling clock signals SAD1 through SAD4.

Although the Up/Down counter is included in each of the delay circuits 368a through 368d in this embodiment, the Up/Down counter may be provided inside the phase comparator 367. This structure requires only one Up/Down counter.

The processing like the third embodiment can be carried out with the sampling clock signals SAD1 through SAD4 and the latch clock signals SLC1 through SLC4 generated in the above manner. Unlike the first through the third embodiments, this embodiment does not require generation of the high-frequency dot clock signal DCLK1 and thereby saves the power consumption of the circuit. This arrangement also avoids the problems (for example, a turbulence of the waveform or a delay) that arise in the course of transferring the high-frequency dot clock signal DCLK1 via the wiring on the printed board. This accordingly facilitates design of the printed board, on which the respective circuits are mounted.

The internal structure of the write sampling clock generator 322 of this embodiment is also applicable to the read sampling clock generator 230 shown in FIG. 8.

E. Fifth Embodiment

Figure 20:
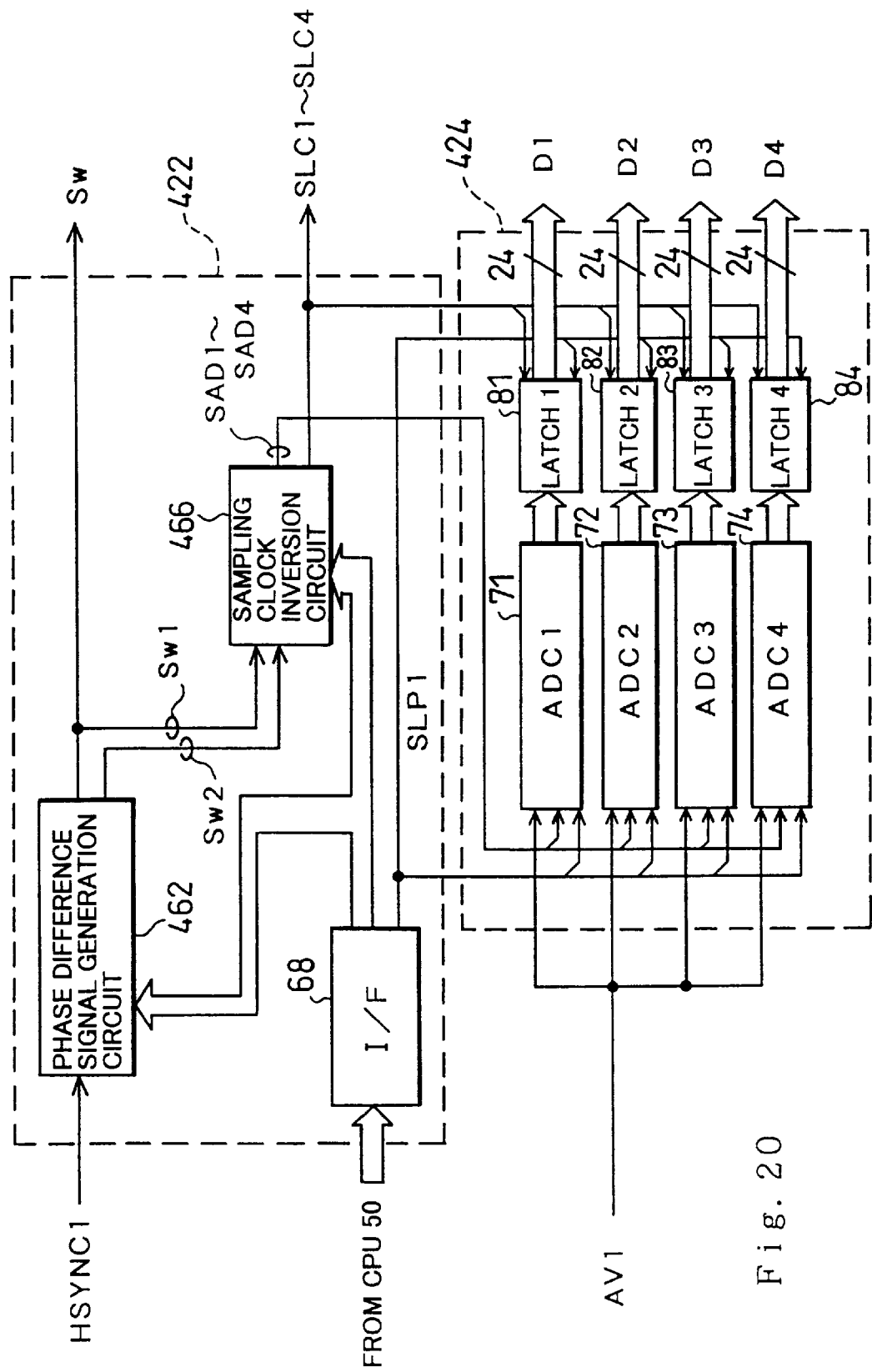
FIG. 20 is a block diagram illustrating the internal structure of a write sampling clock generator 422 and an A-D conversion unit 424 in a fifth embodiment.

FIG. 20 is a block diagram illustrating the internal structure of a write sampling clock generator 422 and an A-D conversion unit 424 in a fifth embodiment. The general structure of an image processing apparatus of the fifth embodiment is substantially similar to the structure shown in FIG. 8. This embodiment, however, uses a phase difference signal generation circuit 462, which generate two write sampling clock signals Sw1 and Sw2 having the phase difference of 90 degrees, in place of the PLL circuit 62 shown in FIG. 9. This embodiment also uses a sampling clock inversion circuit 466, in place of the PLL circuit 64 and the sampling clock selection circuit 266. The phase difference signal generation circuit 462 of this embodiment accordingly corresponds to the first original sampling clock generation circuit of the present invention, and the sampling clock inversion circuit 466 corresponds to the first sampling clock generation circuit.

The phase difference signal generation circuit 462 includes a PLL circuit and outputs the write sampling clock signal Sw1 and the write sampling clock signal Sw2, which has the phase shifted by 90 degrees from that of the write sampling clock signal Sw1, in response to the horizontal synchronizing signal HSYNC1. For example, ICS1522 manufactured by ICS Corp. may be used for the phase difference signal generation circuit 462.

The sampling clock inversion circuit 466 generates the sampling clock signals SAD1 through SAD4 from the input write sampling clock signals Sw1 and Sw2. The signals input into the sampling clock inversion circuit 466 has the phase difference of 90 degrees, so that inversion of the two signals Sw1 and Sw2 inside the inversion circuit 466 readily gives the four sampling clock signals SAD1 through SAD4 having the phases sequentially shifted by every 90 degrees. The four sampling clock signals SAD1 through SAD4 can also be used as the latch clock signals SLC1 through SLC4 in this embodiment.

In this circuit structure, the high-frequency dot clock signal is generated and utilized inside the phase difference signal generation circuit 462 integrated into one-chip configuration, and is not output to the outside of the integrated chip. The arrangement with the phase difference signal generation circuit 462 thus facilitates the design of the printed board, like the fourth embodiment.

The internal structure of the write sampling clock generator 422 of this embodiment is also applicable to the read sampling clock generator 230 shown in FIG. 8.

The present invention is not restricted to the above embodiments or applications, but there may be many other modifications, changes, and alterations without departing from the scope or spirit of the main characteristics of the present invention. Some examples of possible modification are given below.

In the write sampling clock generators 22, 112, and 222 (see FIGS. 2, 6, and 9) in the first through the third embodiments, the first PLL circuit 62 multiplies the horizontal synchronizing signal HSYNC1 by N0 and generates the write sampling clock signal Sw. One modified structure divides the frequency of the dot clock signal DCLK1 to 1/Nw (where Nw denotes the working number of the A-D converters actually used), in order to generate the write sampling clock signal Sw. In this modified structure, one PLL circuit is used to multiply the horizontal synchronizing signal HSYNC1 and generate the dot clock signal DCLK1. In other words, a variety of circuit elements, such as a PLL circuit and a frequency divider, may be applied to generate the write sampling clock signal Sw.

Similar modification is also applicable to the circuits involved in generation of the read sampling clock signal Sr and the dot clock signal DCLK2 in the read sampling clock generator 30 (see FIGS. 4 and 7) of the first through the third embodiments.

In the first through the third embodiments, the PLL circuit 64 (see FIGS. 2, 6, and 9) generates the dot clock signal DCLK1, which is suitable for sampling all the pixels of the analog image signal AV1. The dot clock signal DCLK1 may, however, have a frequency other than the frequency suitable for sampling all the pixels. For example, the dot clock signal DCLK1 may be suitable for skipping the pixels to ½. This means that the dot clock signal DCLK1 may be any clock signal having the frequency that enables sampling the pixels of the analog image signal AV1. The same principle is applicable to the dot clock signal DCLK2 in the read sampling clock generator 30 (see FIGS. 4 and 7).

In the image processing apparatuses of the first through the fifth embodiments, the principle of the present invention is applied to both the structure of inputting the analog image signal and writing the digital image signals into the frame memory 26 (see FIGS. 1, 5, and 8) (that is, the side of A-D conversion) and the structure of reading the digital image signals from the frame memory 26 and outputting the analog image signal (that is, the side of D-A conversion). The principle of the present invention may, however, be applied to only either one of these structures. For example, when the image signal on the side of the A-D conversion has the high frequency and the image signal on the side of the D-A conversion has the low frequency, the structure of the present invention may be applied only for the side of the A-D conversion.

In the above embodiments, part of the structure actualized by the hardware may be replaced by the software, and on the contrary, part of the structure actualized by the software may be replaced by the hardware.

The present invention is applicable to a variety of image processing apparatuses having the functions of A-D conversion and D-A conversion, for example, projector-type display apparatuses like a liquid-crystal projector. The principle of the present invention is not restricted to image display apparatuses with a liquid-crystal panel, but is also applicable to image display apparatuses with another display means, such as a CRT or a plasma display panel, as well as to a variety of electronic apparatuses including such image display apparatuses.

What is claimed is:

1. An image processing apparatus, comprising:
   a first sampling clock generator configured to generate Nw first sampling clock signals which respectively have a first frequency that is synchronous with a first synchronizing signal of a given first analog image signal and phases that are sequentially shifted; and
   an analog-to-digital conversion unit configured to convert the first analog image signal with respect to Nw pixels into Nw digital image signals, the first analog image signal including three analog color components, each of the Nw digital image signals including three digital color components, wherein
      the analog-to-digital conversion unit comprises three sub-units corresponding to three analog color sub-units corresponding to three analog color components, respectively, each sub-unit comprising Nw analog-to-digital converters configured to commonly receive a pre-selected analog color component and to successively carry out analog-to-digital conversion of the received analog color component in response to respective of the Nw first sampling clock signals, so as to generate the Nw digital color components with respect to the Nw pixels, the Nw digital color components having phases sequentially shifted, and
   the image processing apparatus further comprises a processor configured to simultaneously process the Nw digital color components output from the analog-to-digital conversion unit.

2. An image processing apparatus in accordance with claim 1, wherein the first sampling clock generator comprises:
   a first original sampling clock generation circuit that generates a first original sampling clock signal having the first frequency, in response to the first synchronizing signal; and
   a first sampling clock generation circuit that generates the Nw first sampling clock signals having the sequentially shifted phases, in response to the first original sampling clock signal.

3. An image processing apparatus in accordance with claim 2, wherein the first sampling clock generation circuit initializes the Nw first sampling clock signals having the sequentially shifted phases, in response to a pulse of the first synchronizing signal, so that a fixed phase relationship is attained between the first synchronizing signal and each of the Nw first sampling clock signals having the sequentially shifted phases.

4. An image processing apparatus in accordance with claim 2, wherein the first sampling clock generation circuit comprises:
   a first PLL circuit that generates a first dot clock signal having a second frequency suitable for sampling the first analog image signal, in response to the first original sampling clock signal, the second frequency being Nw times the first frequency; and
   a first sampling clock extraction circuit that extracts the Nw first sampling clock signals, which have the first frequency and the phases sequentially shifted by a period of the first dot clock signal, in response to the first dot clock signal.

5. An image processing apparatus in accordance with claim 2, wherein the first sampling clock generation circuit comprises:
   a first delay clock generation circuit that sequentially delays the first original sampling clock signal to generate the Nw first sampling clock signals having the sequentially shifted phases.

6. An image processing apparatus in accordance with claim 1, further comprising:
   an image memory that stores digital image signals; and
   a write control unit that writes the Nw digital image signals output from the analog-to-digital conversion unit into continuous storage areas in the image memory.

7. An image processing apparatus in accordance with claim 1, wherein the first sampling clock generator further comprises:
   a second sampling clock generator circuit that generates Nw second sampling clock signals, which have sequentially shifted phases and maintain fixed phase relations respectively to the Nw first sampling clock signals having the sequentially shifted phases,
   wherein the sub-unit further comprises Nw latch circuits that latch and output the Nw digital color components, which are output form the Nw analog-to-digital converters and have the sequentially shifted phases, in response to the Nw second sampling clock signals having the sequentially shifted phases.

8. An image processing apparatus in accordance with claim 7, wherein the write control unit receives the Nw digital image signals supplied from the analog-to-digital conversion unit and at least one of the Nw second sampling clock signals, which are supplied from the first sampling clock generator and have the sequentially shifted phases.

9. An image processing apparatus in accordance with claim 6, wherein the write control unit comprises plural stages of digital image signal phase regulation circuits that cause the Nw digital image signals, which have the sequentially shifted phases and are supplied from the analog-to-digital conversion unit, to be output in an identical phase, the plural stages of digital image signal phase regulation circuits have a hierarchical structure, in which a number of circuits included in each stage gradually decreases towards a last stage, a plurality of digital image signal phase regulation circuits included in each stage, except the last stage, latch a plurality of input digital image signals in fixed phases, which are different from one another, and supply the latched digital image signals to digital image signal phase regulation circuits included in a next stage, and a digital image signal phase regulation circuit included in the last stage latches the Nw digital image signals supplied from a previous stage in an identical phase.

10. An image processing apparatus in accordance with claim 7, further comprising:

a first switching circuit that supplies at least part of the Nw first sampling clock signals having the sequentially shifted phases to arbitrary analog-to-digital converters selected among the Nw analog-to-digital converters; and a second switching circuit that supplies at least part of the Nw second sampling clock signals having the sequentially shifted phases to selected latch circuits among the Nw latch circuits, the selected latch circuits corresponding to the arbitrary analog-to-digital converters to which the first sampling clock signals are supplied by the first switching circuit.

11. An image processing apparatus in accordance with claim 1, wherein the first sampling clock generator and the analog-to-digital conversion unit are integrated into one chip.

12. An image processing apparatus in accordance with claim 2, further comprising:

a phase regulation circuit that generates an external sampling clock signal from the first original sampling clock signal, the external sampling clock signal having an identical period to that of the first original sampling clock signal and a phase suitable for processing the Nw digital image signals.

13. An image processing apparatus in accordance with claim 1, wherein the Nw analog-to-digital converters for each analog color component are integrated into a separate integrated circuit.

14. An image display apparatus, comprising:

An image processing apparatus in accordance with claim 1; and a display u nit that displays an image processed by the image processing apparatus.

15. An image processing apparatus, comprising:

a second sampling clock generator configured to generate Nr third sampling clock signals, which respectively have a third frequency that is synchronous with a second synchronizing signal of a second analog image signal to be output and phases that are sequentially shifted;

Nr digital-to-analog converters configured to receive digital image signals with respect to Nr pixels in parallel and to carry out digital-to-analog conversion of the digital image signals with respect to the Nr pixels in response to respective of the Nr third sampling clock signals having sequentially shifted phases, so as to generate Nr partial analog image signals having sequentially shifted phases; and a video switch configured to successively select the Nr partial analog image signals output from the Nr digital-to-analog converters, so as to generate the second analog image signal.

16. An image processing apparatus in accordance with claim 15, wherein the second sampling clock generator comprises:

a second original sampling clock generation circuit that generates a second original sampling clock signal having the third frequency, in response to the second synchronizing signal; and a third sampling clock generation circuit that generates the Nr third sampling clock signals having the sequentially shifted phases, in response to the second original sampling clock signal.

17. An image processing apparatus in accordance with claim 16, wherein the third sampling clock generation circuit initializes the Nr third sampling clock signals having the sequentially shifted phases, in response to a pulse of the second synchronizing signal, so that a fixed phase relationship is attained between the second synchronizing signal and each of the Nr third sampling clock signals having the sequentially shifted phases.

18. An image processing apparatus in accordance with claim 16; wherein the third sampling clock generation circuit comprises:

a second PLL circuit that generates a second dot clock signal having a fourth frequency suitable for sampling the second analog image signal, in response to the second original sampling clock signal, the fourth frequency being Nr times the third frequency; and a second sampling clock extraction circuit that extracts the Nr third sampling clock signals, which have the third frequency and the phases sequentially shifted by a period of the second dot clock signal, in response to the second dot clock signal.

19. An image processing apparatus in accordance with claim 16; wherein the third sampling clock generation circuit comprises:

a second delay clock generation circuit that sequentially delays the second original sampling clock signal to generate the Nr third sampling clock signals having the sequentially shifted phases.

20. An image processing apparatus in accordance with claim 15, further comprising:

an image memory that stores digital image signals; and a read control unit that reads the digital image signals with respect to the Nr pixels from the image memory.

21. An image processing apparatus in accordance with claim 20, wherein the read control unit receives at least one of the Nr third sampling clock signals having the sequentially shifted phases, which are supplied from the second sampling clock generator.

22. An image processing apparatus in accordance with claim 15, further comprising:

a third switching circuit that supplies at least part of the Nr third sampling clock signals having the sequentially shifted phases to arbitrary digital-to-analog converters selected among the Nr digital-to-analog converters.

23. An image processing apparatus in accordance with claim 15, wherein the second sampling clock generator and the Nr digital-to-analog converters are integrated into one chip.

24. An image processing apparatus in accordance with claim 15, wherein the Nr digital-to-analog converters are provided for each of plural color signals representing a color image, and the Nr digital-to-analog converters for each color signal are integrated into a separate integrated circuit.

25. An image processing apparatus, comprising:
   an analog-to-digital conversion unit comprising Mw analog-to-digital converters (where Mw is an integer of not less than 2) and configured to receive a common first analog image signal;
   a first sampling clock generator that generates Nw first sampling clock signals, where Nw is an integer of not less than 1 and not greater than Mw and denotes a working number of analog-to-digital converters actually used, said Nw first sampling clock signals respectively having a first frequency that is synchronous with a first synchronizing signal of the first analog image signal and phases that are sequentially shifted; and
   a write control signal regulation unit configured to halt operation of unused (Mw−Nw) analog-to-digital converters according to the working number Nw of the analog-to-digital converters and to control operation of the first sampling clock generator according to the working number Nw so as to cause the Nw analog-to-digital converters to successively carry out analog-to-digital conversion of the first analog image signal in response to the Nw first sampling clock signals having the sequentially shifted phases so as to generate digital image signals with respect to Nw pixels.

26. An image processing apparatus in accordance with claim 25, wherein the first sampling clock generator comprises:
   a first original sampling clock generation circuit that generates a first original sampling clock signal having the first frequency, in response to the first synchronizing signal; and
   a first sampling clock generation circuit that generates the Nw first sampling clock signals having the sequentially shifted phases, in response to the first original sampling clock signal.

27. An image processing apparatus in accordance with claim 26, wherein the first sampling clock generation circuit initializes the Nw first sampling clock signals having the sequentially shifted phases, in response to a pulse of the first synchronizing signal, so that a fixed phase relationship is attained between the first synchronizing signal and each of the Nw first sampling clock signals having the sequentially shifted phases.

28. An image processing apparatus in accordance with claim 26, wherein the first sampling clock generation circuit comprises:
   a first PLL circuit that generates a first dot clock signal having a second frequency suitable for sampling the first analog image signal, in response to the first original sampling clock signal, the second frequency being Nw times the first frequency; and
   a first sampling clock extraction circuit that extracts the Nw first sampling clock signals, which have the first frequency and the phases sequentially shifted by a period of the first dot clock signal, in response to the first dot clock signal.

29. An image processing apparatus in accordance with claim 26, wherein the first sampling clock generation circuit comprises:
   a first delay clock generation circuit that sequentially delays the first original sampling clock signal to generate the Nw first sampling clock signals having the sequentially shifted phases.

30. An image processing apparatus in accordance with claim 25, further comprising:
   an image memory that stores digital image signals; and
   a write control unit that writes the Nw digital image signals output from the analog-to-digital conversion unit into continuous storage areas in the image memory.

31. An image processing apparatus in accordance with claim 25, wherein the first sampling clock generator further comprises:
   a second sampling clock generation circuit that generates Nw second sampling clock signals, which have sequentially shifted phases and maintain fixed phase relations respectively to the Nw first sampling clock signals having the sequentially shifted phases,
   wherein the analog-to-digital conversion unit further comprises Nw latch circuits that latch and output the Nw digital image signals, which are output from the Nw analog-to-digital converters and have the sequentially shifted phases, in response to the Nw second sampling clock signals having the sequentially shifted phases.

32. An image processing apparatus in accordance with claim 31, wherein the write control unit receives the Nw digital image signals supplied from the analog-to-digital conversion unit and at least one of the Nw second sampling clock signals, which are supplied from the first sampling clock generator and have the sequentially shifted phases.

33. An image processing apparatus in accordance with claim 30, wherein the write control unit comprises plural stages of digital image signal phase regulation circuits that cause the Nw digital image signals, which have the sequentially shifted phases and are supplied from the analog-to-digital conversion unit, to be output in an identical phase,
   the plural stages of digital image signal phase regulation circuits have a hierarchical structure, in which a number of circuits included in each stage gradually decreases towards a last stage,
   a plurality of digital image signal phase regulation circuits included in each stage, except the last stage, latch a plurality of input digital image signals in fixed phases, which are different from one another, and supply the latched digital image signals to digital image signal phase regulation circuits included in a next stage, and
   a digital image signal phase regulation circuit included in the last stage latches the Nw digital image signals supplied from a previous stage in an identical phase.

34. An image processing apparatus in accordance with claim 31, further comprising:
   a first switching circuit that supplies at least part of the Nw first sampling clock signals having the sequentially shifted phases to arbitrary analog-to-digital converters selected among the Nw analog-to-digital converters; and
   a second switching circuit that supplies at least part of the Nw second sampling clock signals having the sequentially shifted phases to selected latch circuits among the Nw latch circuits, the selected latch circuits corresponding to the arbitrary analog-to-digital converters to which the first sampling clock signals are supplied by the first switching circuit.

35. An image processing apparatus in accordance with claim 25, wherein the first sampling clock generator and the analog-to-digital conversion unit are integrated into one chip.

36. An image processing apparatus in accordance with claim 25, wherein the Mw analog-to-digital converters are provided for each of plural color signals representing a color image, and the Mw analog-to-digital converters for each color signal are integrated into a separate integrated circuit.

37. An image processing apparatus, comprising:

Mr digital-to-analog converters, where Mr is an integer of not less than 2;

a second sampling clock generator configured to generate Nr third sampling clock signals, where Nr is an integer of not less than 1 and not greater than Mr and denotes a number of Nr working digital-to-analog converters actually used, said Nr third sampling clock signals respectively having a third frequency that is synchronous with a second synchronizing signal of a second analog image signal to be output and phases that are sequentially shifted;

a read control signal regulation unit configured to halt operation of Mr−Nr unused digital-to-analog converters, to control operation of the second sampling clock generator according to the working number Nr, and to cause the Nr digital-to-analog converters to successively carry out digital-to-analog conversion of digital image signals with respect to Nr pixels in response to respective of the Nr third sampling clock signals so as to generate Nr partial analog image signals that have phases sequentially shifted; and a video switch configured to successively select the Nr partial analog image signals output from the Nr digital-to-analog converters so as to generate the second analog image signal.

38. An image processing apparatus in accordance with claim 37, wherein the second sampling clock generator comprises:

a second original sampling clock generation circuit that generates a second original sampling clock signal having the third frequency, in response to the second synchronizing signal; and a third sampling clock generation circuit that generates the Nr third sampling clock signals having the sequentially shifted phases, in response to the second original sampling clock signal.

39. An image processing apparatus in accordance with claim 38, wherein the third sampling clock generation circuit initializes the Nr third sampling clock signals having the sequentially shifted phases, in response to a pulse of the second synchronizing signal, so that a fixed phase relationship is attained between the second synchronizing signal and each of the Nr third sampling clock signals having the sequentially shifted phases.

40. An image processing apparatus in accordance with claim 38, wherein the third sampling clock generation circuit comprises:

a second PLL circuit that generates a second dot clock signal having a fourth frequency suitable for sampling the second analog image signal, in response to the second original sampling clock signal, the fourth frequency being Nr times the third frequency; and a second sampling clock extraction circuit that extracts the Nr third sampling clock signals, which have the third frequency and the phases sequentially shifted by a period of the second dot clock signal, in response to the second dot clock signal.

41. An image processing apparatus in accordance with claim 38, wherein the third sampling clock generation circuit comprises:

a second delay clock generation circuit that sequentially delays the second original sampling clock signal to generate the Nr third sampling clock signals having the sequentially shifted phases.

42. An image processing apparatus in accordance with claim 32, further comprising:

an image memory that stores digital image signals; and a read control unit that reads the digital image signals with respect to the Nr pixels from the image memory.

43. An image processing apparatus in accordance with claim 42, wherein the read control unit receives at least one of the Nr third sampling clock signals having the sequentially shifted phases, which are supplied from the second sampling clock generator.

44. An image processing apparatus in accordance with claim 37, further comprising:

a third switching circuit that supplies at least part of the Nr third sampling clock signals having the sequentially shifted phases to arbitrary digital-to-analog converters selected among the Nr digital-to-analog converters.

45. An image processing apparatus in accordance with claim 37, wherein the second sampling clock generator and the Mr digital-to-analog converters are integrated into one chip.

46. An image processing apparatus in accordance with claim 37, wherein the Mr digital-to-analog converters are provided for each of plural color signals representing a color image, and the Mr digital-to-analog converters for each color signal are integrated into a separate integrated circuit.

* * * * *

UNITED STATES PATENT AND TRADEMARK OFFICE
CERTIFICATE OF CORRECTION

PATENT NO. : 6,590,616 B1
DATED : July 8, 2003
INVENTOR(S) : Takeuchi

It is certified that error appears in the above-identified patent and that said Letters Patent is hereby corrected as shown below:

<u>Title page, Item [54] and Column 1, line 1,</u>
Title, should read:
-- [54] IMAGE PROCESSING APPARATUS AND INTEGRATED CIRCUIT THEREFOR --

Signed and Sealed this

Fourth Day of November, 2003

JAMES E. ROGAN
*Director of the United States Patent and Trademark Office*